US012622219B2

(12) United States Patent
Yun et al.

(10) Patent No.: US 12,622,219 B2
(45) Date of Patent: May 5, 2026

(54) SUBSTRATE PROCESSING APPARATUS

(71) Applicant: Samsung Electronics Co., Ltd., Suwon-si (KR)

(72) Inventors: Byoung Min Yun, Suwon-si (KR); Youn Sok Choi, Suwon-si (KR); Ho Hyun Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 133 days.

(21) Appl. No.: 18/761,829

(22) Filed: Jul. 2, 2024

(65) Prior Publication Data
US 2025/0218842 A1     Jul. 3, 2025

(30) Foreign Application Priority Data
Jan. 2, 2024     (KR) ........................ 10-2024-0000399

(51) Int. Cl.
*H10P 72/50*          (2026.01)
*H10P 72/00*          (2026.01)
*H10P 72/76*          (2026.01)

(52) U.S. Cl.
CPC .......... *H10P 72/53* (2026.01); *H10P 72/0606* (2026.01); *H10P 72/7606* (2026.01)

(58) Field of Classification Search
CPC .. H10P 72/53; H10P 72/0606; H10P 72/7606; G01B 11/14; G01B 11/26
See application file for complete search history.

(56) References Cited

U.S. PATENT DOCUMENTS

| | | | |
|---|---|---|---|
| 10,665,490 | B2 | 5/2020 | Lee et al. |
| 10,903,100 | B2 | 1/2021 | Sugita et al. |
| 11,404,296 | B2 | 8/2022 | Potter et al. |
| 11,468,590 | B2 | 10/2022 | Chen et al. |
| 11,538,701 | B2 | 12/2022 | Lee et al. |
| 2022/0179000 | A1 | 6/2022 | Jang et al. |
| 2022/0203415 | A1* | 6/2022 | Kwak ............... H01L 21/67751 |
| 2022/0254666 | A1 | 8/2022 | Sadeghi et al. |
| 2023/0199992 | A1 | 6/2023 | Criminale et al. |
| 2024/0030054 | A1* | 1/2024 | Ko .................... H01L 21/67259 |

FOREIGN PATENT DOCUMENTS

| | | |
|---|---|---|
| WO | 23069463 A1 | 4/2023 |

* cited by examiner

*Primary Examiner* — Tony Ko
(74) *Attorney, Agent, or Firm* — Fish & Richardson P.C.

(57) ABSTRACT

A substrate processing apparatus may include a substrate support unit in a lower portion of a process chamber; an edge ring on and along an edge of an upper surface of the substrate support unit and protruding from the upper surface of the substrate support unit; and a substrate alignment sensor on the substrate support unit. The substrate alignment sensor may include a body, an imaging unit, and a control unit. The imaging unit may be on a bottom surface of the body and configured to image a sidewall of the edge ring and a sidewall of the body. The control unit may be configured to control the imaging unit and calculate a spacing between the sidewall of the edge ring and the sidewall of the body. The control unit may be configured to align the substrate alignment sensor with the substrate support unit based on the spacing.

20 Claims, 26 Drawing Sheets

SUBSTRATE PROCESSING APPARATUS

CROSS-REFERENCE TO RELATED APPLICATION

This application claims priority from Korean Patent Application No. 10-2024-0000399, filed on Jan. 2, 2024 in the Korean Intellectual Property Office, and all the benefits accruing therefrom under 35 U.S.C. 119, the contents of which in its entirety are herein incorporated by reference.

BACKGROUND

Technical Field

The present disclosure relates to a substrate processing apparatus.

Description of Related Art

To manufacture a semiconductor device or a liquid crystal display, various processes such as photolithography, etching, ashing, ion implantation, thin film deposition, and cleaning are performed on a wafer.

In order to perform various processes in various chambers, it may be required to transfer or return the wafer to or from the chamber. In this regard, accuracy of processes performed on the wafer may be improved only when the wafer is properly seated on an electrostatic chuck in the chamber.

SUMMARY

An aspect of the present disclosure provides a substrate processing apparatus with improved reliability.

Aspects of the present disclosure are not limited to the above-mentioned aspects. Other aspects and advantages according to the present disclosure that are not mentioned may be understood based on following descriptions, and may be more clearly understood based on embodiments according to the present disclosure. Further, it will be easily understood that the aspects and advantages according to the present disclosure may be realized using means shown in the claims and combinations thereof.

According to an example embodiment of the present disclosure, a substrate processing apparatus may include a process chamber configured to have a substrate loaded therein; a substrate support unit in a lower portion of the process chamber, the substrate support unit being configured to support the substrate; an edge ring along an edge of the substrate support unit and spaced apart from a sidewall of the substrate support unit; and a substrate alignment sensor on the substrate support unit. An upper surface of the edge ring may include a first portion, a second portion, and a third portion. The first portion and the second portion may extend parallel to each other. The third portion may be between the first portion and the second portion, and the third portion may be inclined. Based on a bottom surface of the process chamber, a vertical level of the first portion may be lower than a vertical level of the second portion. The substrate alignment sensor may include a body, an imaging unit, and a control unit. The imaging unit may be on a bottom surface of the body and configured to image an upper surface of the edge ring and a sidewall of the body. The control unit may be configured to control the imaging unit and calculate a calculated spacing from the sidewall of the body to a boundary between the first portion of the edge ring and the third portion of the edge ring. The control unit may be configured to align the substrate alignment sensor with the substrate support unit based on the calculated spacing.

According to an example embodiment of the present disclosure, a substrate processing apparatus may include a process chamber configured to have a substrate loaded therein; a substrate support unit in a lower portion of the process chamber, the substrate support unit being configured to support the substrate; an edge ring on and along an edge of an upper surface of the substrate support unit and protruding from the upper surface of the substrate support unit; and a substrate alignment sensor on the substrate support unit. The substrate alignment sensor may include a body, an imaging unit, and a control unit. The imaging unit may be on a bottom surface of the body and may be configured to image a sidewall of the edge ring and a sidewall of the body. The control unit may be configured to control the imaging unit and calculate a calculated spacing between the sidewall of the edge ring and the sidewall of the body. The control unit may be configured to align the substrate alignment sensor with the substrate support unit based on the calculated spacing.

According to an example embodiment of the present disclosure, a substrate processing apparatus may include a process chamber configured to have a substrate loaded therein; a substrate support unit in a lower portion of the process chamber, the substrate support unit being configured to support the substrate; an edge ring along an edge of the substrate support unit and spaced apart from a sidewall of the substrate support unit; and a substrate alignment sensor on the substrate support unit. An upper surface of the edge ring may include a first portion, a second portion, and a third portion. The first portion and the second portion may extend parallel to each other. The third portion may be between the first portion and the second portion. The third portion may be inclined. Based on a bottom surface of the process chamber, a vertical level of the first portion may be lower than a vertical level of the second portion. The substrate alignment sensor may include a body, a groove recessed from a bottom surface of the body toward an upper surface of the body, an illuminator, an imaging unit, and a control unit. The illuminator may be in the groove and configured to irradiate light in a first direction toward the edge ring. The imaging unit may be in the groove and configured to image an upper surface of the edge ring and a sidewall of the body. The control unit may be configured to control the imaging unit and calculate a calculated spacing from the sidewall of the body to a boundary between the first portion and the third portion of the edge ring. The imaging unit may face a second direction. The second direction may intersect the first direction. The imaging unit may include a first unit and a second unit. The first unit and the second unit may be opposite each other in the first direction. The control unit may be configured to align the substrate alignment sensor with the substrate support unit by equalizing a first spacing and a second spacing. The first spacing may be a distance from the sidewall of the body to the boundary between the first portion and the third portion of the edge ring on an image captured by the first unit. The second spacing may be a distance from the sidewall of the body to the boundary between the first portion and the third portion of the edge ring on an image captured by the second unit.

It should be noted that aspects and effects of the present disclosure are not limited to those described above, and other aspects and effects of the present disclosure will be apparent from the following description.

BRIEF DESCRIPTION OF DRAWINGS

The above and other aspects and features of the present disclosure will become more apparent by describing in detail example embodiments thereof with reference to the attached drawings, in which.

DETAILED DESCRIPTIONS

As used herein, although terms such as first, second, etc. are used to describe various elements or components, these elements or components are not limited by these terms. These terms are merely used to distinguish one element or component from another element or component. Therefore, a first element or component as mentioned below may be a second element or component within the scope of technical ideas of the present disclosure.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

When the terms "about" or "substantially" are used in this specification in connection with a numerical value, it is intended that the associated numerical value includes a manufacturing or operational tolerance (e.g., +10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes. When ranges are specified, the range includes all values therebetween such as increments of 0.1%. While the term "equal to" is used in the description of example embodiments, it should be understood that some imprecisions may exist. Thus, when one element is referred to as "equal to" another element, it should be understood that an element or a value may be "equal to" another element within a desired manufacturing or operational tolerance range (e.g., +10%).

Figure 1:
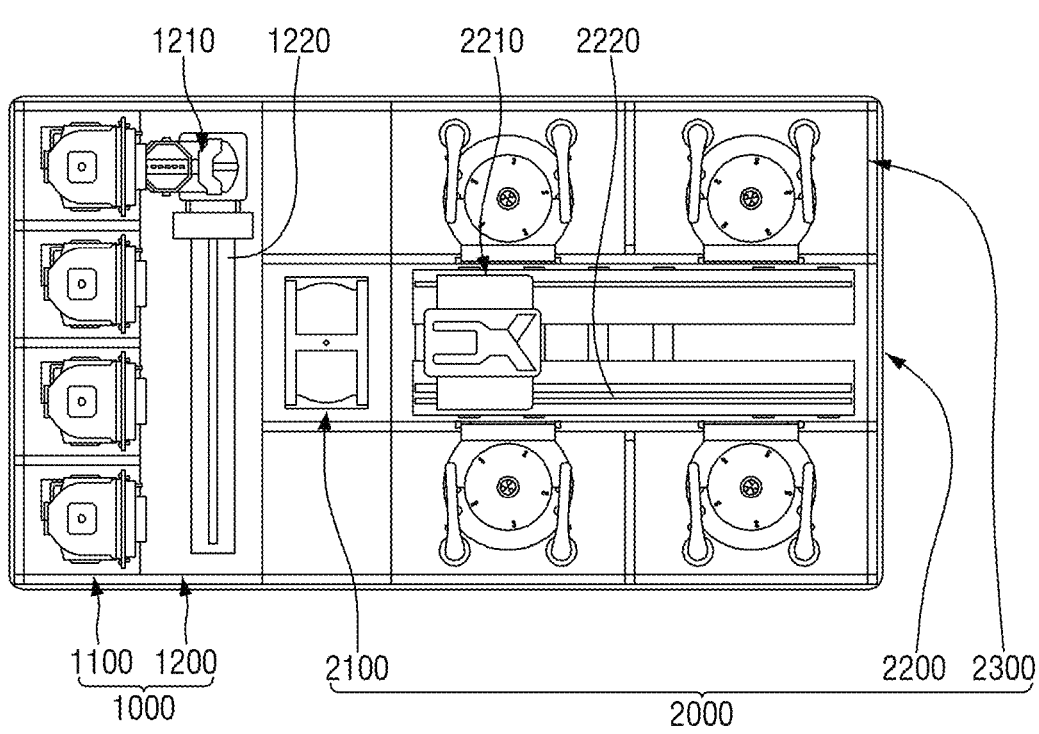
FIG. 1 is a plan view for illustrating a substrate processing system according to some embodiments of the present disclosure.

Hereinafter, first, a substrate processing system according to some embodiments will be described with reference to FIG. 1. FIG. 1 is a plan view for illustrating a substrate processing system according to some embodiments of the present disclosure.

Referring to FIG. 1, a substrate processing system according to some embodiments may include an index module 1000 and a process module 2000.

The index module 1000 receives a substrate from an external place and transfers the substrate to the process module 2000. The process module 2000 may perform at least one of a cleaning process, a deposition process, an etching process, and an ashing process. The index module 1000 may be an equipment front end module (EFEM). The index module 1000 may include a load port 1100 and a transfer frame 1200.

The load port 1100 may accommodate therein a substrate. The substrate may be disposed on a container within the load port 1100. The container may be embodied as a front opening unified pod (FOUP). The container may be brought into the load port 1100 from an external place by an overhead transfer (OHT). The container may be taken out from the load port 1100 by the overhead transfer. The transfer frame 1200 may transfer the substrate between the container disposed in the load port 1100 and the process module 2000.

The process module 2000 may be a module that actually performs a process. The process module 2000 may include a buffer chamber 2100, a transfer chamber 2200, and a process apparatus 2300. In some embodiments, the process apparatus 2300 may be in a form of a tower including a plurality of process chambers. However, embodiments of the present disclosure are not limited thereto.

The buffer chamber 2100 provides a space where the substrate transferred between the index module 1000 and the process module 2000 temporarily stays. The buffer chamber 2100 may provide a buffer slot in which the substrate is disposed. The transfer robot 2210 of the transfer chamber 2200 may withdraw the substrate disposed in the buffer slot and transfer the substrate to the process apparatus 2300. The buffer chamber 2100 may provide a plurality of buffer slots.

The transfer chamber 2200 transfers the substrate between the buffer chamber 2100 and the process apparatus 2300, which are disposed around the transfer chamber 2200. The transfer chamber 2200 may include a transfer robot 2210 and a transfer rail 2220. The transfer robot 2210 may move on and along the transfer rail 2220 and may transfer the substrate.

In some embodiments, the process apparatus 2300 may be a substrate processing apparatus. For example, at least one of a cleaning process, a deposition process, an etching process, and an ashing process may be performed within the process apparatus 2300.

Some of the process apparatuses 2300 may be disposed on one side of the transfer chamber 2200. The others of the process apparatus 2300 may be disposed on the other side of the transfer chamber 2200. That is, a plurality of process apparatuses 2300 may be arranged to face each other while being disposed on both opposing sides of the transfer chamber 2200.

The process module 2000 may be provided with the plurality of process apparatus 2300. The plurality of process apparatuses 2300 may be oriented or face in a row while being disposed on one side of the transfer chamber 2200. However, technical ideas of the present disclosure are not limited thereto.

The arrangement of the process apparatuses 2300 is not limited to the above-described example, and may vary based on a footprint or process efficiency of the apparatus.

Next, the substrate processing apparatus according to some embodiments will be described with reference to FIGS. 2 to 8.

Figure 2:
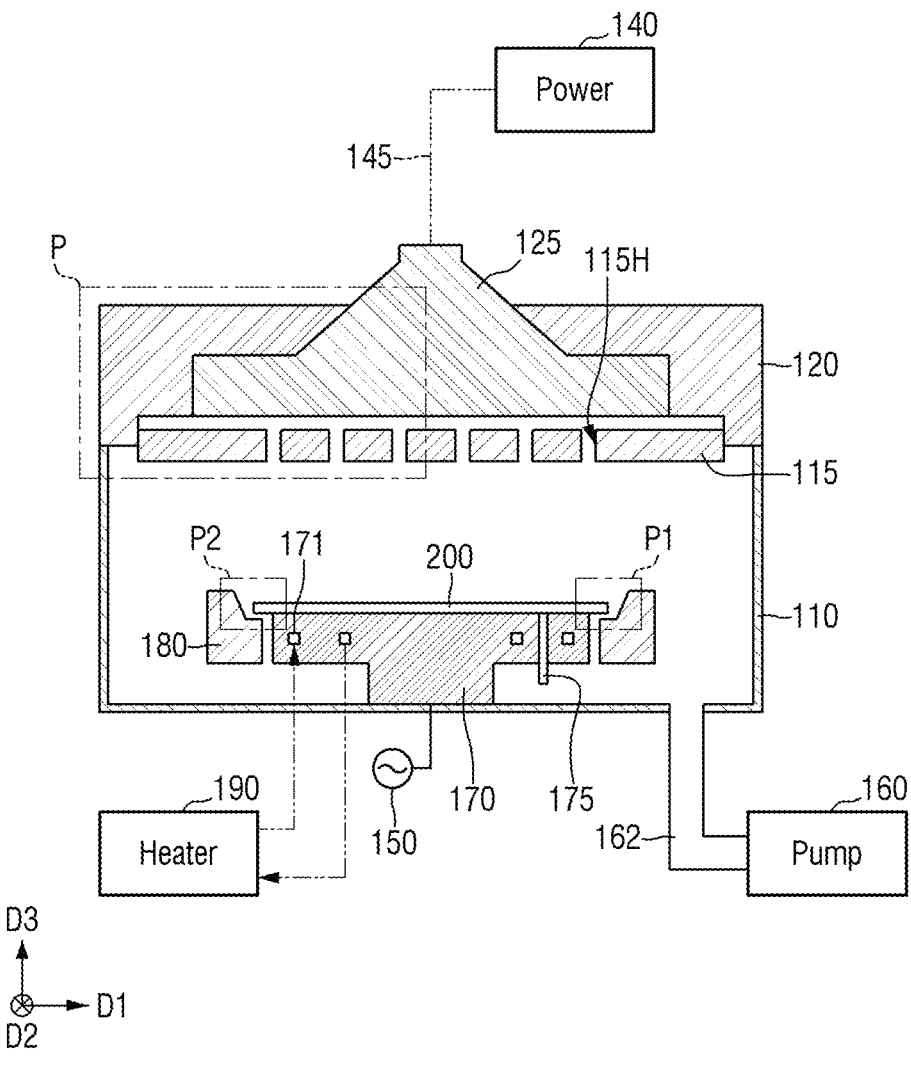
FIG. 2 is a diagram for illustrating a substrate processing apparatus according to some embodiments of the present disclosure.
Figure 3:
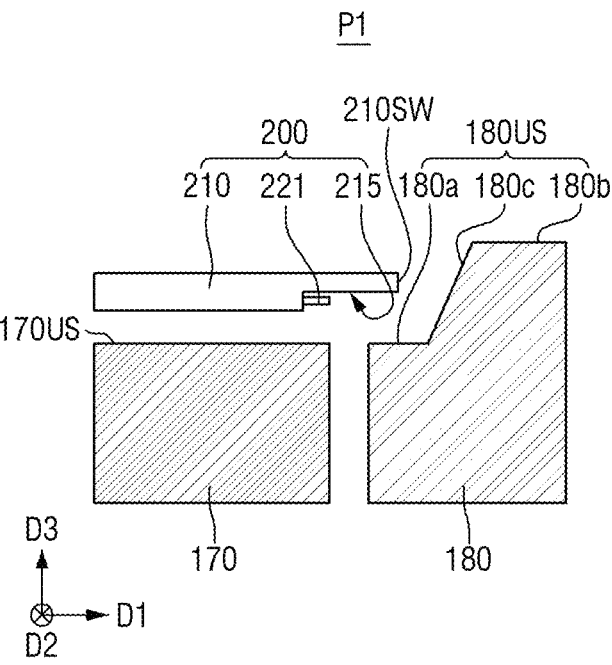
FIG. 3 is an enlarged view of a P1 area in FIG. 2.
Figure 4:
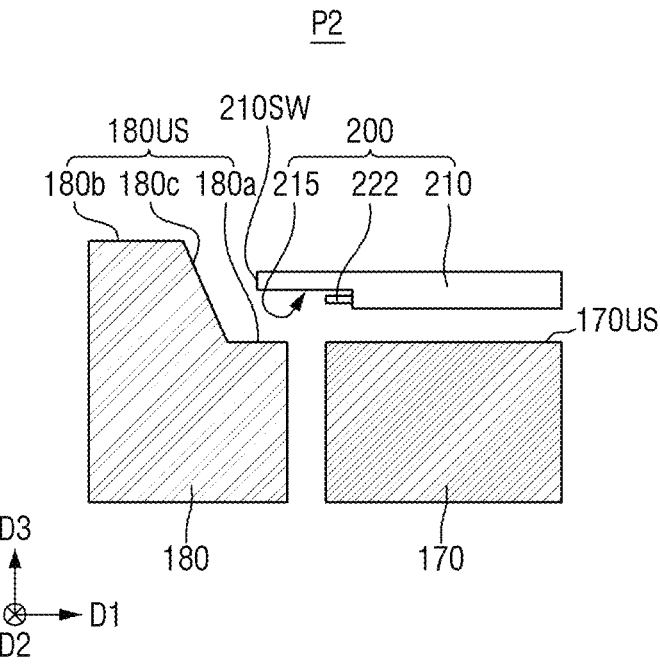
FIG. 4 is an enlarged view of a P2 area in FIG. 2.
Figure 5:
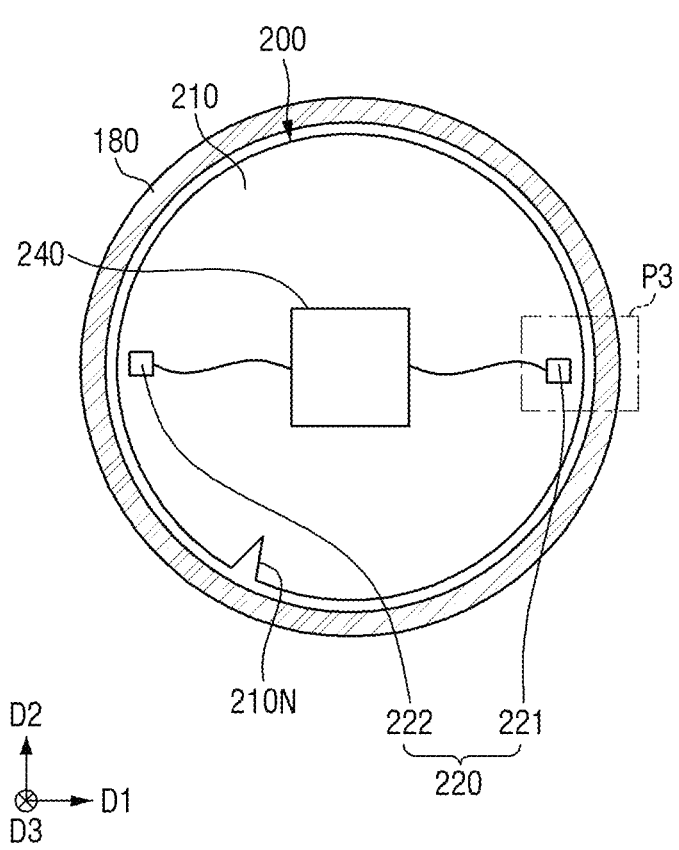
FIG. 5 is a plan view for illustrating a substrate alignment sensor in FIG. 2.
Figure 6:
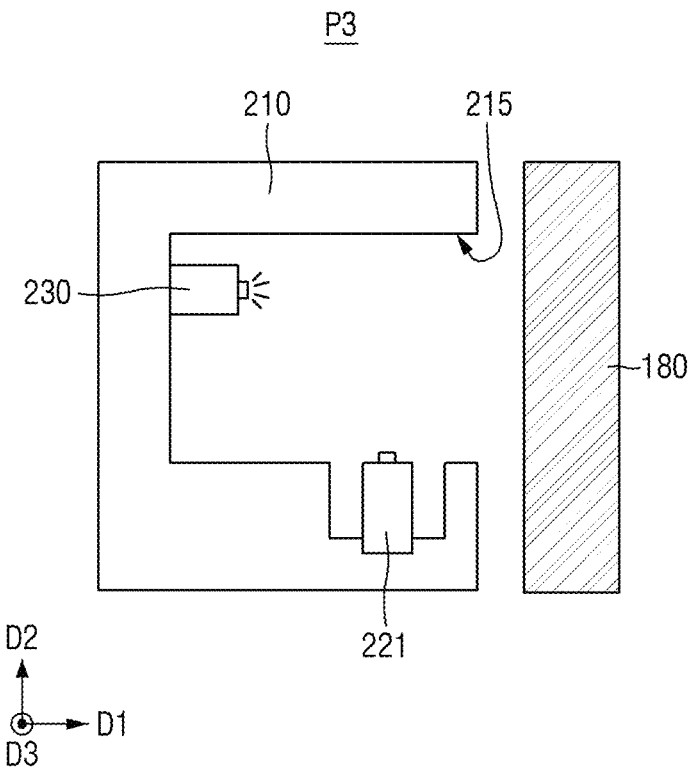
FIG. 6 is a bottom plan view of a P3 area in FIG. 5.
Figure 7:
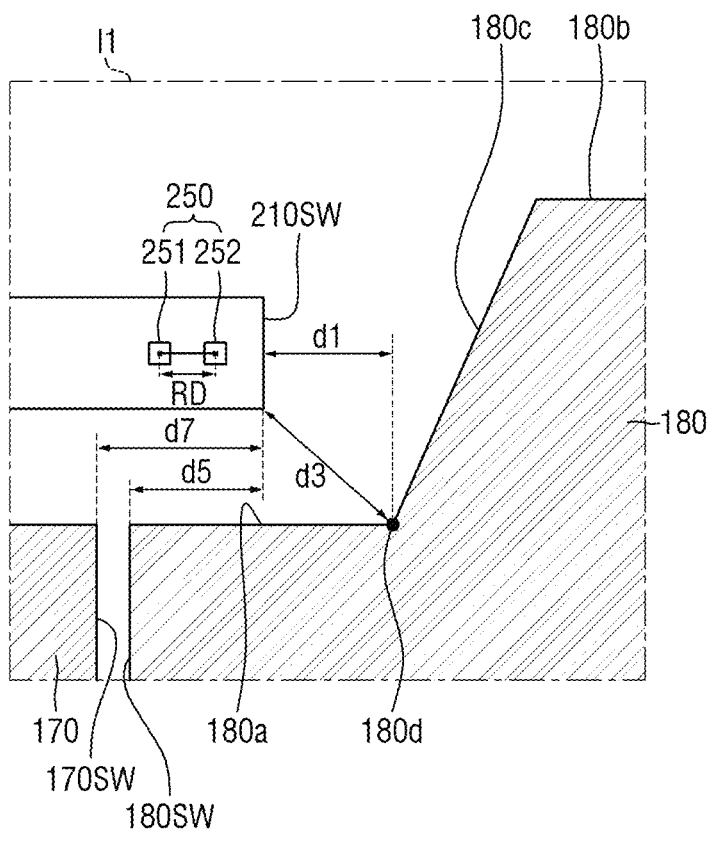
FIG. 7 is a diagram showing a first image imaged by a first unit.
Figure 8:
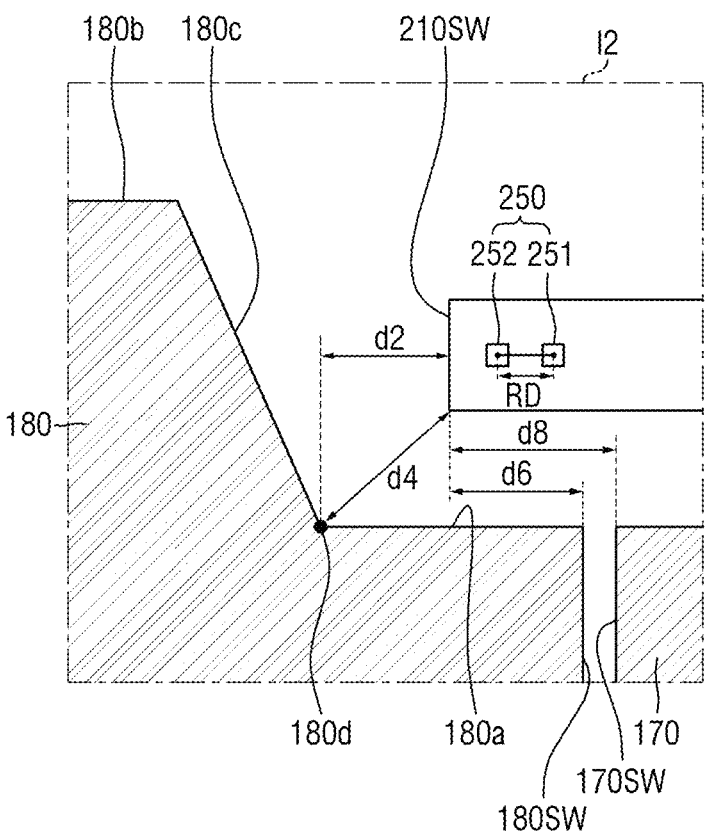
FIG. 8 is a diagram showing a second image imaged by a second unit.

FIG. 2 is a diagram for illustrating a substrate processing apparatus according to some embodiments of the present disclosure. FIG. 3 is an enlarged view of a P1 area in FIG. 2. FIG. 4 is an enlarged view of a P2 area in FIG. 2. FIG. 5 is a plan view for illustrating the substrate alignment sensor in FIG. 2. FIG. 6 is a bottom plan view of a P3 area in FIG. 5. FIG. 7 is a diagram showing a first image imaged by a first unit. FIG. 8 is a diagram showing a second image imaged by a second unit.

First, referring to FIGS. 2 to 6, the substrate processing apparatus according to some embodiments may include a process chamber 110, a shower head 115, a lid 120, an adapter 125, and a power source 140.

The substrate processing apparatus according to some embodiments may be a chamber for processing a substrate using plasma and/or radicals. For example, within the substrate processing apparatus, a plasma processing process may be performed on the substrate. For example, an etching process using plasma may be performed on the substrate. However, the process is not limited thereto. Depending on an embodiment, a deposition process, an etching process, and a cleaning process may be performed together within the substrate processing apparatus.

As used herein, the term "substrate" may mean the substrate itself, or a stack structure including the substrate and a desired and/or alternatively predetermined layer or film formed on the surface. Furthermore, the term "a surface of a substrate" may mean an exposed surface of the substrate itself, or an exposed surface of the desired and/or alternatively predetermined layer or film formed on the substrate. For example, the substrate may be a wafer, or may include a wafer and at least one material film on the wafer. The material film may be an insulating film and/or a conductive film formed on the wafer through various schemes such as deposition, coating and plating. For example, the insulating film may include an oxide film, a nitride film, or an oxynitride film, and the conductive film may include a metal film or a polysilicon film. The material film may be a single film or a stack of films formed on the wafer. Furthermore, the material film may be formed on the wafer so as to have a desired and/or alternatively predetermined pattern.

The process chamber 110 may define a processing area. More specifically, the process chamber 110, the shower head 115, and the lid 120 may define the processing area. The processing area refers to an area where the substrate is processed. The processing area may be sealed from an external surrounding. An overall outer structure of the process chamber 110 may have a shape of a cylinder, an elliptical column, or a polygonal column. The process chamber 110 may be generally made of a metal material and may be maintained at an electrical ground state to block noise from the outside during the plasma process.

Although not shown, a liner may be provided along and on an inner surface of a wall of the process chamber 110. The liner may protect the process chamber 110 and may limit and/or prevent metal contamination due to internal arcing by covering metal structures within the process chamber 110. The liner may be made of a metal material such as aluminum or a ceramic material. Furthermore, the liner may be made of a material film that is resistant to plasma. In this regard, the material film that is resistant to plasma may be, for example, an yttrium oxide ($Y_2O_3$) film. However, the material film that is resistant to the plasma is not limited to the yttrium oxide film.

The process chamber 110 may be connected to an exhaust pump 160 through an exhaust pipe 162. By-products after the plasma process may be discharged through the discharge pipe 162 using the exhaust pump 160. Furthermore, the exhaust pump 160 may perform a function of controlling a pressure inside the process chamber 110.

The shower head 115 may be installed within the process chamber 110. The shower head 115 may include a plurality of plasma holes 115H through which gas can flow. Plasma supplied from an external source to the process chamber 110 may be evenly distributed to the processing area through the plasma holes 115H of the shower head 115.

The power source 140 may be installed outside the process chamber 110. The power source 140 may generate plasma and/or radicals and supply the plasma and/or radicals to the processing area. For example, the power source 140 may supply the plasma and/or the radicals to the processing area through a plasma supply line 145. The plasma and/or the radicals are supplied to the processing area through the adapter 125 and the shower head 115. The power source 140 may generate the plasma and/or the radicals by applying power to the gas. The power may be applied, for example, as radio frequency (RF) power in a form of electromagnetic waves having a desired and/or alternatively predetermined frequency and intensity. Furthermore, the power may be applied in a form of electromagnetic waves with an on-off cycle and in a form of a continuous wave or in a form of a pulse.

For reference, the plasma may contain various components such as radicals, ions, electrons, and ultraviolet rays. At least one of the radicals, ions, electrons, ultraviolet rays, etc. may be used in the processing on the substrate, for example, in the etching, cleaning, deposition, or ashing process. Basically, the radicals are electrically neutral and the ions are electrically polar. Accordingly, the radicals may be used to isotropically remove a cleaning or ashing target in a cleaning or ashing process using plasma, or to isotropically remove an etching target in an etching process using plasma. Furthermore, the radicals may be used to hinder or inhibit deposition of a specific component in the deposition process.

The adapter 125 may be disposed between the power source 140 and the shower head 115. The adapter 125 may be a path through which plasma and/or radicals supplied from the power source 140 may flow. The plasma and/or the radicals generated from the power source 140 may flow through the adapter 125 and may be provided to the shower head 115. The adapter 125 has a structure that an area size is the largest at a bottom, and an area size gradually decreases as the adapter extends in a direction from the bottom to a top thereof. That is, the adapter 125 has a structure in which a portion thereof facing the power source 140 has the smallest area and a portion thereof facing the shower head 115 has the largest area.

The lid 120 may be disposed on top of the process chamber 110. The lid 120 may surround at least a portion of the adapter 125. The lid 120 may surround a portion of a sidewall of the shower head 115. The adapter 125 may protrude beyond an upper surface of the lid 120 in a third direction D3. However, embodiments of the present disclosure are not limited thereto. The lid 120 may be made of a metal material such as aluminum (Al). However, embodiments of the present disclosure are not limited thereto.

The lid 120 may be generally made of a metal material and may be maintained at an electrical ground state to block noise from the outside during the plasma process. Although not shown, a liner may be provided along and on an inner surface of the lid 120. The liner may protect the lid 120 and may limit and/or prevent metal contamination due to internal arcing by covering metal structures within the lid 120. In one example, the liner may be made of a metal material such as aluminum or a ceramic material. Furthermore, the liner may be composed of a material film that is resistant to plasma. In this regard, the material film that is resistant to the plasma may be, for example, an yttrium oxide ($Y_2O_3$) film. It is obvious that the material film that is resistant to plasma is not limited to the yttrium oxide film.

A substrate support unit 170 may be installed inside the process chamber 110. The substrate support unit 170 may be disposed in a lower portion of the process chamber 110. The substrate may be disposed on the substrate support unit 170, and a substrate alignment sensor 200 may be disposed on the substrate support unit 170. Specifically, before various semiconductor processes are performed within the process chamber 110, the substrate alignment sensor 200 may be first brought into the chamber 110 so that the substrate alignment sensor 200 may be disposed on the substrate support unit 170 so as to be correctly aligned therewith. Afterwards, the substrate alignment sensor 200 may be taken out of the chamber, and the substrate may be loaded into the chamber, and the semiconductor processes may be performed on the substrate.

The substrate support unit 170 may include an electrostatic chuck configured to support the substrate thereon using an electro-static force, and a chuck support for supporting the electrostatic chuck thereon. The electrostatic chuck may receive an electrode for chucking and de-chucking the substrate therein. The chuck support may support the electrostatic chuck disposed thereon and may be made of a metal such as aluminum or a ceramic insulator such as alumina. A heating member such as a heater may be disposed in the chuck support, and heat from the heater may be transferred to the electrostatic chuck or the substrate. Furthermore, a power application line connected to the electrode of the electrostatic chuck may be disposed in the chuck support. However, the configuration of the substrate support unit 170 is not limited thereto, and the substrate support unit 170 may include a vacuum chuck configured to support the substrate using a vacuum, or may be configured to mechanically support the substrate thereon.

The substrate support unit 170 may include a lift pin 175. The lift pin 175 may be configured to lift the substrate or the substrate alignment sensor 200 from a surface of the substrate support unit 170 on which the substrate or the substrate alignment sensor 200 is mounted. The lift pin 175 may be accommodated in a hole defined in the substrate support unit 170. The lift pin 175 may be installed to be movable in a direction (the third direction D3) perpendicular to the substrate support unit 170. The lift pin 175 may move in the vertical direction (the third direction D3) to raise and lower the substrate or the substrate alignment sensor 200. The substrate support unit 170 may include a suitable number of lift pins 175 to support the substrate or the substrate alignment sensor 200. For example, the substrate support unit 170 may include three or more lift pins 175 evenly spaced from each other along a circumferential direction of the substrate support unit 170. However, embodiments of the present disclosure are not limited thereto.

The lift pin 175 may be brought into a pin-up state in which the lift pin protrudes upwardly beyond the substrate support unit 170 to support the substrate or the substrate alignment sensor 200 thereon when the substrate or the substrate alignment sensor 200 is brought into the substrate processing apparatus or when the substrate or the substrate alignment sensor 200 is taken out from the substrate processing apparatus. Conversely, while the substrate is being processed in the process chamber 110, the lift pin 175 may be brought into a pin-down state in which the lift pin is lowered down to a position under an upper surface of the substrate support unit 170 so that the substrate may be disposed on the substrate supports unit 170.

An RF bias source 150 may be connected to the substrate support unit 170. The RF bias source 150 may apply the RF power to the substrate support unit 170. In some embodiments, the RF bias source 150 may apply the RF power lower of a low frequency lower than about 200 kHz to the substrate support unit 170 during a cleaning process, deposition process, the ashing process, and/or the etching process on the substrate. In some embodiments, the RF bias source 150 may remove the RF power supplied to the substrate support unit 170 while a cleaning process, a deposition process, an ashing process, and/or an etching process on the substrate is in progress.

In some embodiments, the substrate support unit 170 may further include a heating member 171.

The heating member 171 may be connected to a heater 190. The heater 190 may heat the substrate support unit 170. The heater 190 may supply heat to the heating member 171 of the substrate support unit 170. The heater 190 may control an amount of the heat supplied through the heating member 171 to control a temperature of the substrate support unit 170 and a temperature of the substrate mounted on the substrate support unit 170. The heater 190 may include circuitry for generating heat and the heating member 171 may include a thermally conductive material (e.g., a resistive coil) for conducting heat from the heater 190 through the substrate support unit 170, but example embodiments are not limited thereto.

An edge ring 180 may be disposed along an edge of the substrate support unit 170. The edge ring 180 may be spaced apart from a sidewall of the substrate support unit 170. The edge ring 180 may surround the substrate or the substrate alignment sensor 200. The edge ring 180 may accurately seat the substrate and serve as a focus ring to intensively supply the plasma to the substrate.

The substrate processing apparatus according to some embodiments may further include the substrate alignment sensor 200. The substrate alignment sensor 200 may be used to properly align the substrate before the substrate is loaded onto the substrate support unit 170. For example, the substrate alignment sensor 200 includes a body 210 that has the same size as that of the substrate. Therefore, when the substrate alignment sensor 200 is correctly aligned with the substrate support unit 170, the substrate to be loaded later may also be correctly aligned with the substrate support unit 170.

The substrate alignment sensor 200 according to some embodiments may include the body 210, an imaging unit 220, an illuminator 230 (e.g., LED, laser, bulb), a control unit 240, and a reference mark 250.

First, the body 210 is provided. A size of the body 210 may be the same as the size of the substrate or the wafer. For example, a diameter of the body 210 may be about 300 mm. However, technical ideas of the present disclosure are not limited thereto. In some embodiments, the body 210 may include a notch 210N. The notch 210N may be provided to align the substrate alignment sensor 200 with the substrate support unit 170. The notch 210N may be disposed in an edge area of the body 210. The notch 210N may be formed to have a desired and/or alternatively predetermined depth in a direction from an edge of the body 210 toward a center of the body 210.

In FIG. 5, the imaging unit 220 may include a first unit 221 and a second unit 222. The first unit 221 and the second unit 222 may be opposite to each other in a first direction D1. The first unit 221 and the second unit 222 may be spaced apart from each other in the first direction D1. The first unit 221, the second unit 222, third unit 223 (see FIGS. 16-18), and fourth unit 224 (see FIG. 18) each may include a camera and/or other device with image capturing and processing circuitry. However, technical ideas of the present disclosure are not limited thereto.

As used herein, the first direction D1, a second direction D2, and the third direction D3 may intersect each other. The first direction D1, the second direction D2, and the third direction D3 may be substantially perpendicular to each other. The first direction D1 and the second direction D2 may be parallel to an upper surface of the substrate alignment sensor, and the third direction D3 may be perpendicular to the upper surface of the substrate alignment sensor.

The control unit 240 may be disposed in a central area of the body 210. The control unit 240 may control the imaging unit 220. The control unit 240 may calculate a spacing between the body 210 and the edge ring 180 using the imaging unit 220. Specifically, the imaging unit 220 may obtain a plurality of images by imaging the body 210 and the edge ring 180, and the control unit 240 may use the images to calculate the spacing between the body 210 and the edge ring 180. This will be described in detail later using FIG. 7 and FIG. 8.

In FIG. 3 and FIG. 6, the substrate alignment sensor 200 further includes a groove 215. The groove 215 may be recessed in the third direction D3 from a bottom surface of the substrate alignment sensor 200 toward the upper surface thereof. Each of the imaging unit 220 and the illuminator 230 may be disposed within the groove 215.

The illuminator 230 may be disposed within the groove 215. The illuminator 230 may be disposed within the groove 215 and may be oriented or face in the first direction D1. The illuminator 230 may irradiate light toward the edge ring 180. Since the light is emitted from the illuminator 230, the imaging unit 220 may clearly image the edge ring 180. The illuminator 230 irradiates the light in the first direction D1. In this regard, the imaging unit 220 may be oriented or face in the second direction D2. The imaging unit 220 may be oriented in parallel with a sidewall of the body 210, and the imaging unit 220 may be oriented in parallel with a sidewall of the edge ring 180.

The illuminator 230 disposed in the first direction D1 may mean that the light provided from the illuminator 230 travels in the first direction D1. The imaging unit 220 disposed in the second direction D2 may mean that an angle of view (AOV) of the imaging unit 220 faces in the second direction D2. That is, a direction in which the light emitted from the illuminator 230 travels and the angle of view (AOV) of the imaging unit may intersect each other.

In FIG. 3 and FIG. 4, the edge ring 180 may include an upper surface 180US. The upper surface 180US of the edge ring 180 may include a first portion 180a, a second portion 180b, and a third portion 180c. The first portion 180a and the second portion 180b may extend in a parallel manner with each other. For example, the first portion 180a and the second portion 180b may be disposed on a plane extending in the first direction D1 and the second direction D2.

The first portion 180a may be disposed at a lower vertical level than that of the second portion 180b. For example, based on a bottom surface of the process chamber 110, a level of the first portion 180a may be lower than a level of the second portion 180b. The first portion 180a may be coplanar with the upper surface 170US of the substrate support unit 170. The third portion 180c may be interposed between the first portion 180a and the second portion 180b. The third portion 180c may have an inclination.

The imaging unit 220 may image a sidewall 210SW of the body 210 and the upper surface 180US of the edge ring 180. Specifically, the first unit 221 may image the upper surface 180US of the edge ring 180 spaced apart from the sidewall 210SW of the body 210 in the first direction D1, and the second unit 222 may image the upper surface 180US of the edge ring 180 spaced apart from the sidewall 210SW of the body 210 in a direction opposite to the first direction D1.

Referring to FIG. 7, the first unit 221 may image a first image I1. The first image I1 may be an image of the sidewall 210SW of the body 210 and the upper surface 180US of the edge ring 180. Furthermore, the first unit 221 may image the reference mark 250. The reference mark 250 may be formed on the body 210 of the substrate alignment sensor 200. The control unit 240 may check whether the substrate alignment sensor 200 is correctly aligned with the substrate support unit 170 using the reference mark 250.

Specifically, the control unit 240 may calculate a first spacing d1. The first spacing d1 may be a distance from the sidewall 210SW of the body 210 to the upper surface 180US of the edge ring 180. More specifically, the first spacing d1 may be a distance in the first direction D1 from the sidewall 210SW of the body 210 to a boundary 180d between the first portion 180a and the third portion 180c of the edge ring 180.

The first spacing d1 may be calculated using the reference mark 250. For example, the reference mark 250 includes a first mark 251 and a second mark 252. The first mark 251 and the second mark 252 may be spaced apart from each other in the first direction D1. A spacing RD between the first mark 251 and the second mark 252 may be a preset value. For example, the spacing RD between the first mark 251 and the second mark 252 may be in a range of 500 μm to 1 mm. However, technical ideas of the present disclosure are not limited thereto.

The control unit 240 may calculate a ratio of the spacing RD between the first mark 251 and the second mark 252 with respect to the first spacing d1 on the first image I1. Thus, the first spacing d1 may be accurately calculated based on the ratio.

In another embodiment, the control unit 240 may calculate a third spacing d3. The third spacing d3 may be a distance from the sidewall 210SW of the body 210 to the upper surface 180US of the edge ring 180. More specifically, the third spacing d3 may be a minimum distance from the sidewall 210SW of the body 210 to the boundary 180d between the first portion 180a and the third portion 180c of the edge ring 180.

The third spacing d3 may be calculated using the reference mark 250. For example, the control unit 240 may calculate a ratio of the spacing RD between the first mark 251 and the second mark 252 with respect to the third spacing d3 on the first image I1. Thus, the third spacing d3 may be accurately calculated based on the ratio.

In another embodiment, the control unit 240 may calculate a fifth spacing d5. The fifth spacing d5 may be a distance from the sidewall 210SW of the body 210 to the sidewall 180SW of the edge ring 180 in the direction opposite to the first direction D1.

The fifth spacing d5 may be calculated using the reference mark 250. For example, the control unit 240 may calculate a ratio of the spacing RD between the first mark 251 and the second mark 252 with respect to the fifth spacing d5 on the first image I1. Thus, the fifth spacing d5 may be accurately calculated based on the ratio.

In still another embodiment, the control unit 240 may calculate a seventh spacing d7. The seventh spacing d7 may be a distance in the direction opposite to the first direction D1 from the sidewall 210SW of the body 210 to the sidewall 170SW of the substrate support unit 170.

The seventh spacing d7 may be calculated using the reference mark 250. For example, the control unit 240 may calculate a ratio of the spacing RD between the first mark 251 and the second mark 252 with respect to the seventh spacing d7 on the first image I1. Thus, the seventh spacing d7 may be accurately calculated based on the ratio.

Referring to FIG. 8, the second unit 222 may image a second image 12. The second image 12 may be an image of the sidewall 210SW of the body 210 and the upper surface 180US of the edge ring 180. Furthermore, the second unit 222 may image the reference mark 250. The reference mark 250 may be formed on the body 210 of the substrate alignment sensor 200. Thus, The control unit 240 may check whether the substrate alignment sensor 200 is correctly aligned with the substrate support unit 170 using the reference mark 250.

Specifically, the control unit 240 may calculate a second spacing d2. The second spacing d2 may be a distance from the sidewall 210SW of the body 210 to the upper surface 180US of the edge ring 180. More specifically, the second spacing d2 may be a distance in the direction opposite to the first direction D1 from the sidewall 210SW of the body 210 to the boundary 180d between the first portion 180a and the third portion 180c of the edge ring 180.

The second spacing d2 may be calculated using the reference mark 250. For example, the control unit 240 may calculate a ratio of the spacing RD between the first mark 251 and the second mark 252 with respect to the second spacing d2 on the second image 12. Thus, the second spacing d2 may be accurately calculated based on the ratio.

In another embodiment, the control unit 240 may calculate a fourth spacing d4. The fourth spacing d4 may be a distance from the sidewall 210SW of the body 210 to the upper surface 180US of the edge ring 180. More specifically, the fourth spacing d4 may be a minimum distance from the sidewall 210SW of the body 210 to the boundary 180d between the first portion 180a and the third portion 180c of the edge ring 180.

The fourth spacing d4 may be calculated using the reference mark 250. For example, the control unit 240 may calculate a ratio of the spacing RD between the first mark 251 and the second mark 252 with respect to the fourth spacing d4 on the second image 12. Thus, the fourth spacing d4 may be accurately calculated based on the ratio.

In still another embodiment, the control unit 240 may calculate a sixth spacing d6. The sixth spacing d6 may be a distance in the first direction D1 from the sidewall 210SW of the body 210 to the sidewall 180SW of the edge ring 180.

The sixth spacing d6 may be calculated using the reference mark 250. For example, the control unit 240 may calculate a ratio of the spacing RD between the first mark 251 and the second mark 252 with respect to the sixth spacing d6 in the first image I1. Thus, the sixth spacing d6 may be accurately calculated based on the ratio.

In still another embodiment, the control unit 240 may calculate an eighth spacing d8. The eighth spacing d8 may be a distance in the first direction D1 from the sidewall 210SW of the body 210 to the sidewall 170SW of the substrate support unit 170.

The eighth spacing d8 may be calculated using the reference mark 250. For example, the control unit 240 may calculate a ratio of the spacing RD between the first mark 251 and the second mark 252 with respect to the eighth spacing d8 on the first image I1. Thus, the eighth spacing d8 may be accurately calculated based on the ratio.

In some embodiments, when the first spacing d1 and the second spacing d2 are different from each other, it may be determined that the substrate alignment sensor 200 is not correctly aligned with the substrate support unit 170. At this time, the control unit 240 may realign the substrate alignment sensor 200. The substrate alignment sensor 200 may be displaced to a certain position until the first spacing d1 and the second spacing d2 become equal to each other.

When the first spacing d1 and the second spacing d2 are equal to each other, it may be determined that the substrate alignment sensor 200 is correctly aligned with the substrate support unit 170. That is, when the substrate alignment sensor 200 is correctly aligned with the substrate support unit 170, the first spacing d1 and the second spacing d2 may be equal to each other.

Furthermore, when the third spacing d3 and the fourth spacing d4 are different from each other, it may be determined that the substrate alignment sensor 200 is not correctly aligned with the substrate support unit 170. At this time, the control unit 240 may realign the substrate alignment sensor 200. The substrate alignment sensor 200 may be displaced to a certain position until the third spacing d3 and the fourth spacing d4 become equal to each other.

When the third spacing d3 and the fourth spacing d4 are equal to each other, it may be determined that the substrate alignment sensor 200 is correctly aligned with the substrate support unit 170. That is, when the substrate alignment sensor 200 is correctly aligned with the substrate support unit 170, the third spacing d3 and the fourth spacing d4 may be equal to each other.

Furthermore, when the fifth spacing d5 and the sixth spacing d6 are different from each other, it may be determined that the substrate alignment sensor 200 is not correctly aligned with the substrate support unit 170. At this time, the control unit 240 may realign the substrate alignment sensor 200. The substrate alignment sensor 200 may be displaced to a certain position until the fifth spacing d5 and the sixth spacing d6 become equal to each other.

When the fifth spacing d5 and the sixth spacing d6 are equal to each other, it may be determined that the substrate alignment sensor 200 is correctly aligned with the substrate support unit 170. That is, when the substrate alignment sensor 200 is correctly aligned with the substrate support unit 170, the fifth spacing d5 and the sixth spacing d6 may be equal to each other.

Furthermore, when the seventh spacing d7 and the eighth spacing d8 are different from each other, it may be determined that the substrate alignment sensor 200 is not correctly aligned with the substrate support unit 170. At this time, the control unit 240 may realign the substrate alignment sensor 200. The substrate alignment sensor 200 may be displaced to a certain position until the seventh spacing d7 and the eighth spacing d8 become equal to each other.

When the seventh spacing d7 and the eighth spacing d8 are equal to each other, it may be determined that the substrate alignment sensor 200 is correctly aligned with the substrate support unit 170. That is, when the substrate alignment sensor 200 is correctly aligned with the substrate support unit 170, the seventh spacing d7 and the eighth spacing d8 may be equal to each other.

Hereinafter, with reference to FIGS. 9 to 18, a substrate processing apparatus according to further some embodiments of the present disclosure is described. For convenience of description, contents duplicate the contents as described above using FIG. 1 to FIG. 8 will be simply described or the descriptions thereof are omitted.

FIGS. 9 to 18 are example diagrams for illustrating a substrate processing apparatus according to further some embodiments of the present disclosure. For reference, FIG. 9 to FIG. 18 may be diagrams for illustrating a substrate alignment sensor according to further some embodiments of the present disclosure, respectively. In particular, FIGS. 9 to 14 may be bottom views of the substrate alignment sensor, and FIGS. 15 to 18 may be top views of the substrate alignment sensor.

Figure 9:
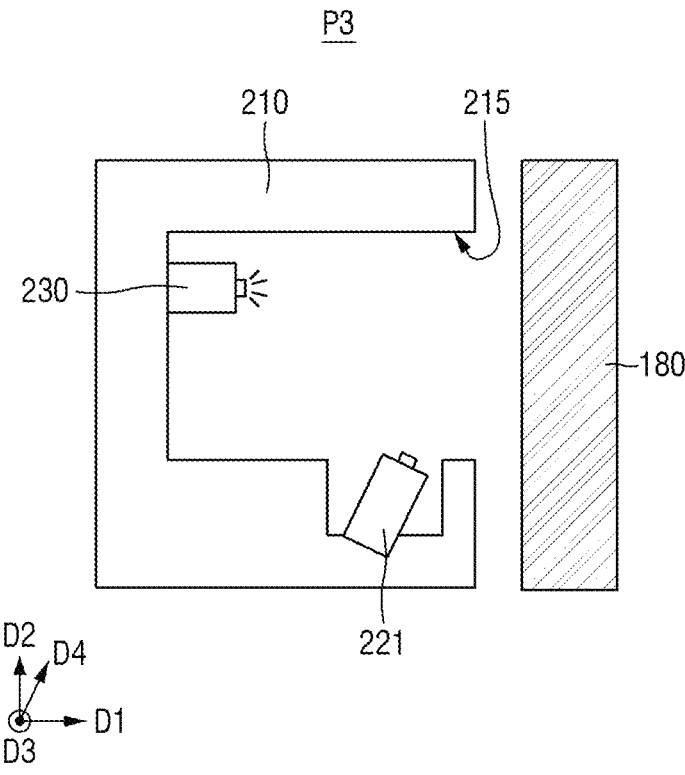
FIGS. 9 to 18 are example diagrams for illustrating a substrate processing apparatus according to further some embodiments of the present disclosure.

First, referring to FIG. 9, the first unit 221 may not be oriented or face in the second direction D2. That is, the angle of view (AOV) of the first unit 221 may face in a direction other than the second direction D2. For example, the first unit 221 may be oriented or face in the fourth direction D4. The fourth direction D4 may be present on a plane defined by the first direction D1 and the second direction D2. The fourth direction D4 may intersect each of the first direction D1 and the second direction D2. The fourth direction D4 may be any direction between the first direction D1 and the second direction D2.

As the first unit 221 is oriented or face in the fourth direction D4, a proportion occupied by the edge ring 180 in the image imaged by the first unit 221 may increase. Accordingly, a spacing between the body 210 and the edge ring 180 may be precisely measured.

Figure 10:
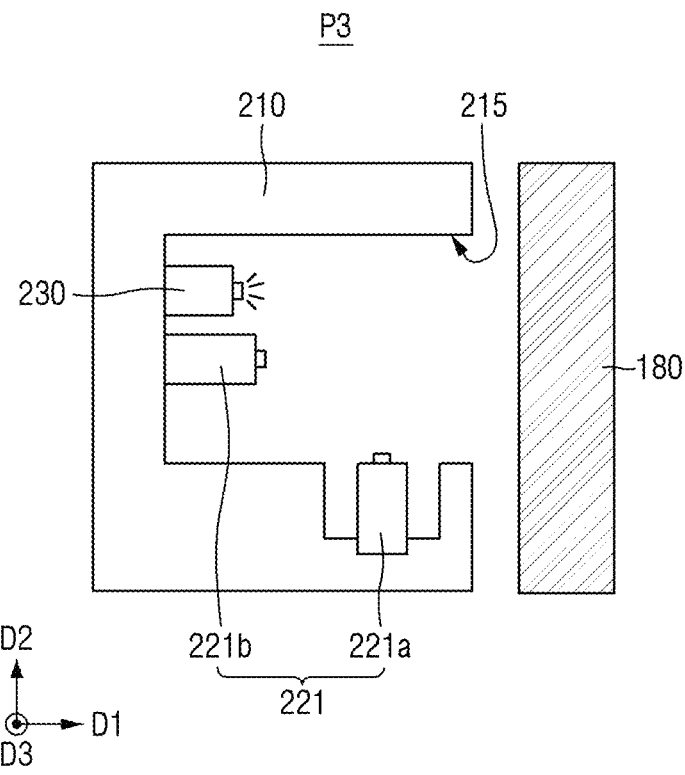

Referring to FIG. 10, the first unit 221 may include two sub-units within the groove 215. For example, the first unit 221 may include a first sub-unit 221a and a second sub-unit 221b. The first sub-unit 221a may be oriented or face in the second direction D2. The second sub-unit 221b may be oriented or face in the first direction D1. That is, the first sub-unit 221a may be oriented or face in a direction intersecting the orientation of the illuminator 230, and the second sub-unit 221b may be oriented or face in a direction parallel to the orientation of the illuminator 230.

In other words, the angle of view (AOV) of the first sub-unit 221a may be different from the angle of view (AOV) of the second sub-unit 221b. As the first unit 221 includes the two sub-units and the angles of view (AOV) of the sub-units are different from each other, the precision of the image imaged by the first unit 221 may be further improved.

Figure 11:
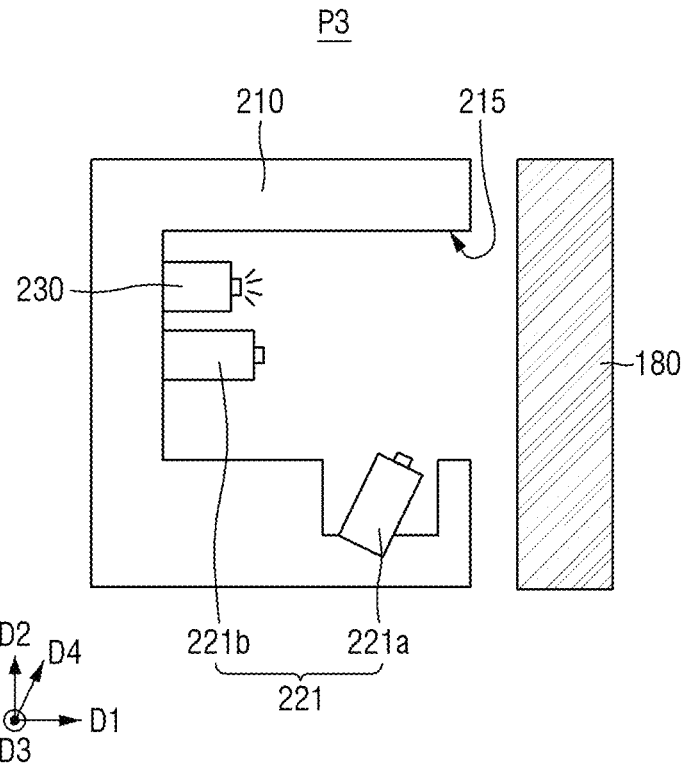

Referring to FIG. 11, the first unit 221 may include two sub-units within the groove 215. For example, the first unit 221 may include the first sub-unit 221a and the second sub-unit 221b. The first sub-unit 221a may be oriented or face in the fourth direction D4. The second sub-unit 221b may be oriented or face in the first direction D1. That is, the first sub-unit 221a may be oriented or face in a direction intersecting the orientation of the illuminator 230, and the second sub-unit 221b may be oriented or face in a direction parallel to the orientation of the illuminator 230. The fourth direction D4 may be disposed on a plane defined by the first direction D1 and the second direction D2. The fourth direction D4 may intersect each of the first direction D1 and the second direction D2. The fourth direction D4 may be any direction between the first direction D1 and the second direction D2.

In other words, the angle of view (AOV) of the first sub-unit 221a may be different from the angle of view (AOV) of the second sub-unit 221b. As the first unit 221 includes the two sub-units and the angles of view (AOV) of the sub-units are different from each other, the precision of the image imaged by the first unit 221 may be further improved.

Figure 12:
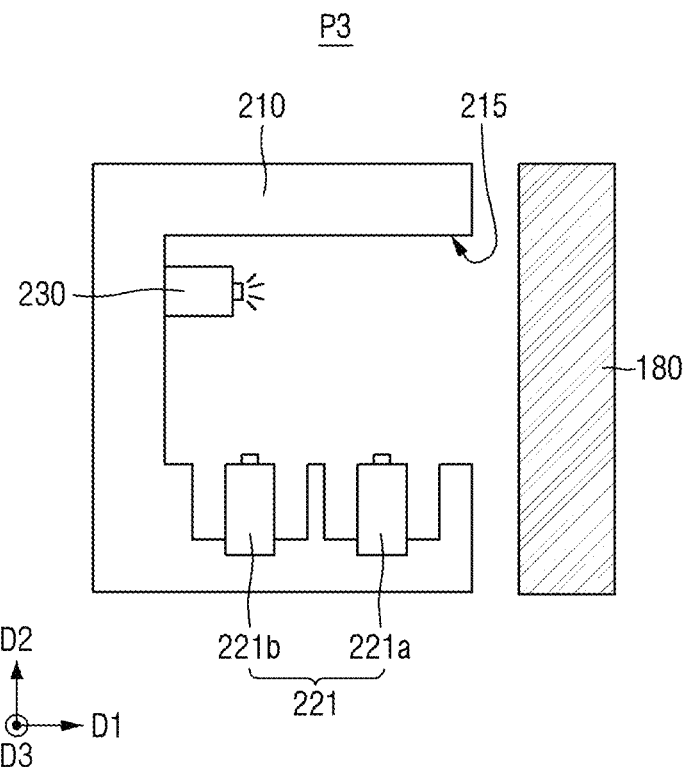

Referring to FIG. 12, the first unit 221 may include two sub-units within the groove 215. For example, the first unit 221 may include the first sub-unit 221a and the second sub-unit 221b. The first sub-unit 221a and the second sub-unit 221b may be oriented or face in the same direction. For example, both the first sub-unit 221a and the second sub-unit 221b may be oriented or face in the second direction D2.

In other words, the angle of view (AOV) of the first sub-unit 221a may be the same as the angle of view (AOV) of the second sub-unit 221b.

Figure 13:
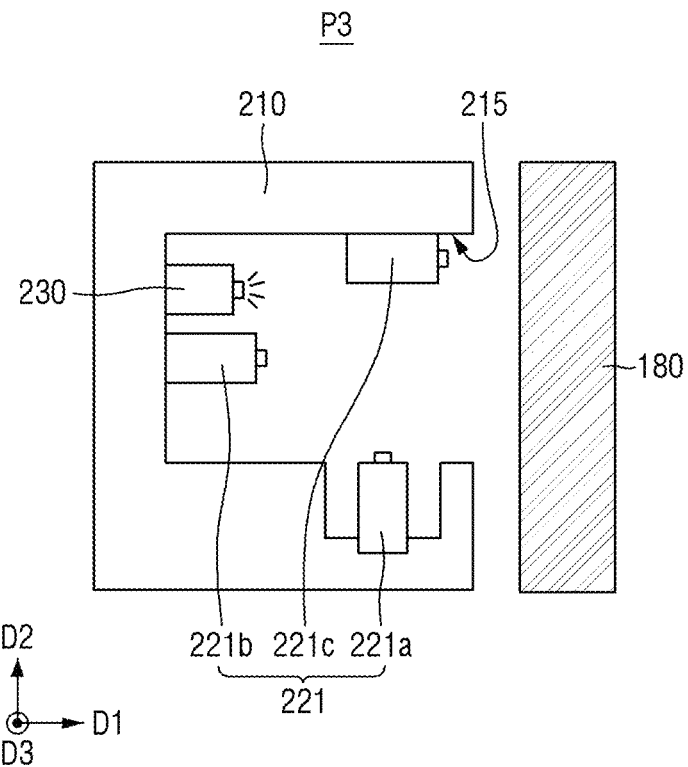

Referring to FIG. 13, the first unit 221 may include three sub-units within the groove 215. For example, the first unit 221 may include the first sub-unit 221a, the second sub-unit 221b, and a third sub-unit 221c. The first sub-unit 221a may be oriented or face in the second direction D2. Each of the second sub-unit 221b and the third sub-unit 221c may be oriented or face in the first direction D1. That is, the first sub-unit 221a may be oriented or face in the direction intersecting the orientation of the illuminator 230, and each of the second sub-unit 221b and the third sub-unit 221c may be oriented or face in parallel with the orientation of the illuminator 230.

In other words, the angle of view (AOV) of the first sub-unit 221a may be different from the angle of view (AOV) of each of the second sub-unit 221b and the third sub-unit 221c. As the first unit 221 includes the three sub-units, and the angles of view of the sub-units are different from each other, the precision of the image imaged by the first unit 221 may be further improved.

Figure 14:
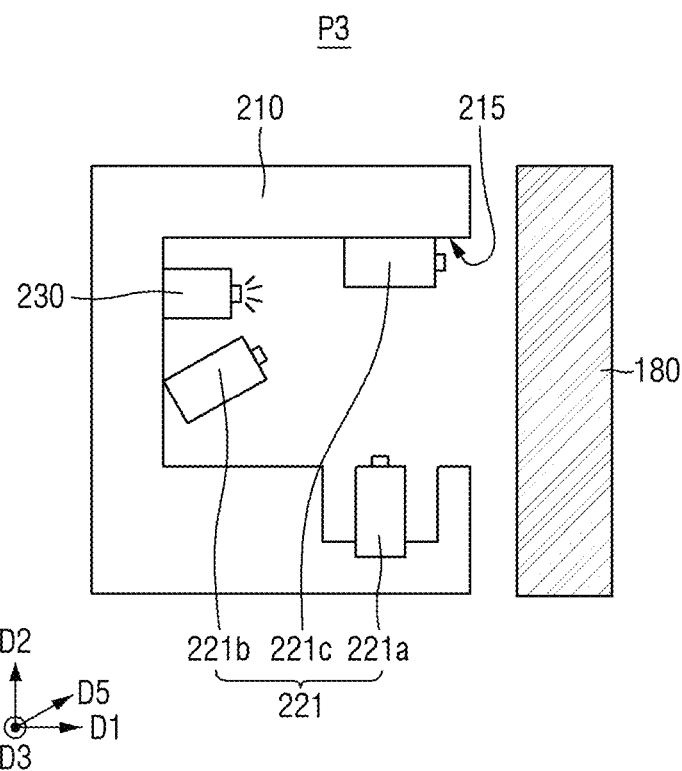

Referring to FIG. 14, the angles of view (AOV) of the first sub-unit 221a, the second sub-unit 221b, and the third sub-unit 221c may be different from each other. For example, the first sub-unit 221a may be oriented or face in the second direction D2. The second sub-unit 221b may be oriented or face in a fifth direction D5. The third sub-unit 221c may be oriented or face in the first direction D1.

The fifth direction D5 may be disposed on a plane defined by the first direction D1 and the second direction D2. The fifth direction D5 may intersect each of the first direction D1 and the second direction D2. The fifth direction D5 may be any direction between the first direction D1 and the second direction D2.

Since the first unit 221 includes the three sub-units having different angles of view (AOV), the precision of the first image imaged by the first unit 221 may be further improved.

Figure 15:
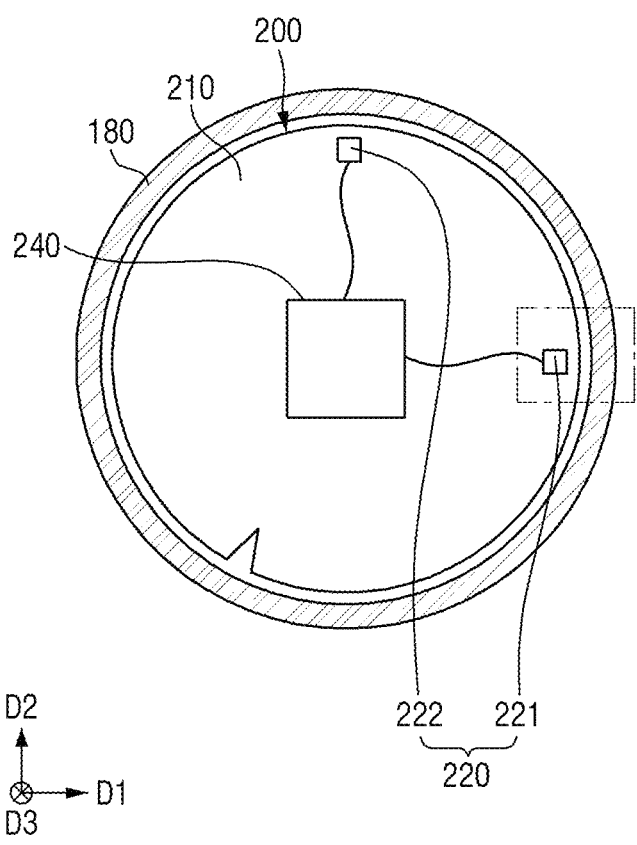

Referring to FIG. 15, the first unit 221 and the second unit 222 may not be opposed to each other in the first direction D1. The first unit 221 and the second unit 222 may be arranged so as to be spaced from each other by a right angle. For example, the control unit 240 and the first unit 221 may be spaced apart from each other in the first direction D1, and the control unit 240 and the second unit 222 may be spaced apart from each other in the second direction D2.

However, technical ideas of the present disclosure are not limited thereto. An angle defined by the first unit 221 and the second unit 222 may not be 180 or 90°. The angle defined by the first unit 221 and the second unit 222 may be, for example, 45°, 60°, or 130°. The angle defined by the different units may vary depending on a design.

Figure 16:
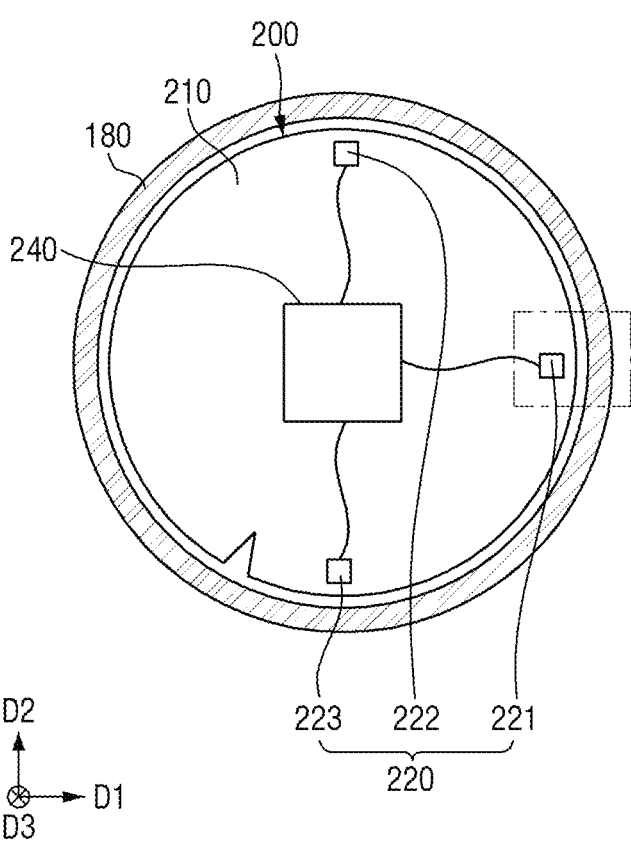
Figure 17:
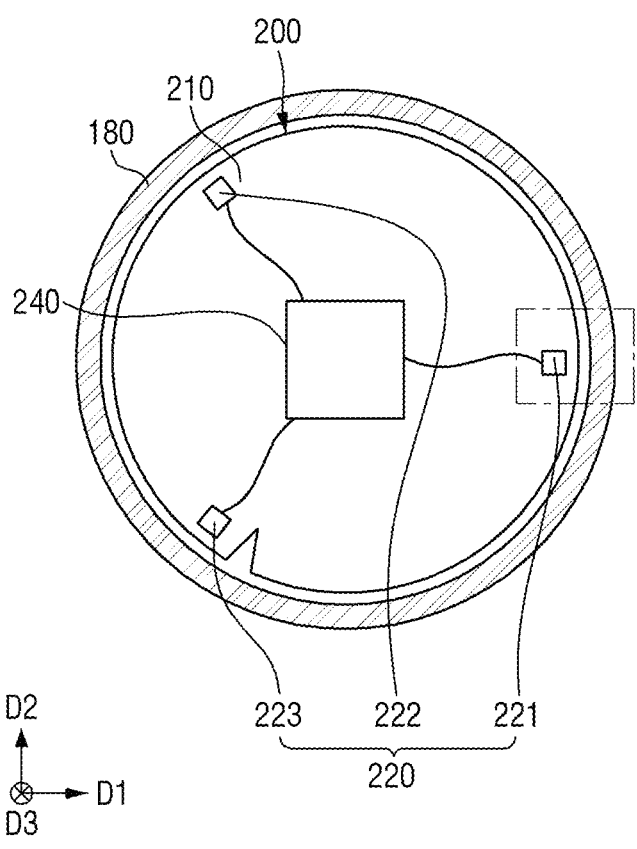

Referring to FIG. 16 and FIG. 17, the imaging unit 220 may include three units. For example, the imaging unit 220 may include the first unit 221, the second unit 222, and a third unit 223.

In FIG. 16, the first unit 221, the second unit 222, and the third unit 223 may be arranged so as to be spaced from each other by a right angle. For example, the control unit 240 and the first unit 221 may be spaced apart from each other in the first direction D1, and the control unit 240 and the second unit 222 may be spaced apart from each other in the second direction D2. The control unit 240 and the third unit 223 may be spaced apart from each other in a direction opposite to the second direction D2.

However, technical ideas of the present disclosure are not limited thereto. Depending on a design of the product, the angle defined by the first unit 221 and the second unit 222, the angle defined by the second unit 222, and the third unit 223, and the angle defined by the third unit 223 and the first unit 221 may vary.

In FIG. 17, the first unit 221, the second unit 222, and the third unit 223 may be arranged so as to be spaced from each other by the same angular spacing. For example, the angle defined by the first unit 221 and the second unit 222 around a center of the substrate alignment sensor 200 may be 120°. The angle defined by the first unit 221 and the third unit 223 around the center of the substrate alignment sensor 200 may be 120°. The angle defined by the second unit 222 and the third unit 223 around the center of the substrate alignment sensor 200 may be 120°.

Figure 18:
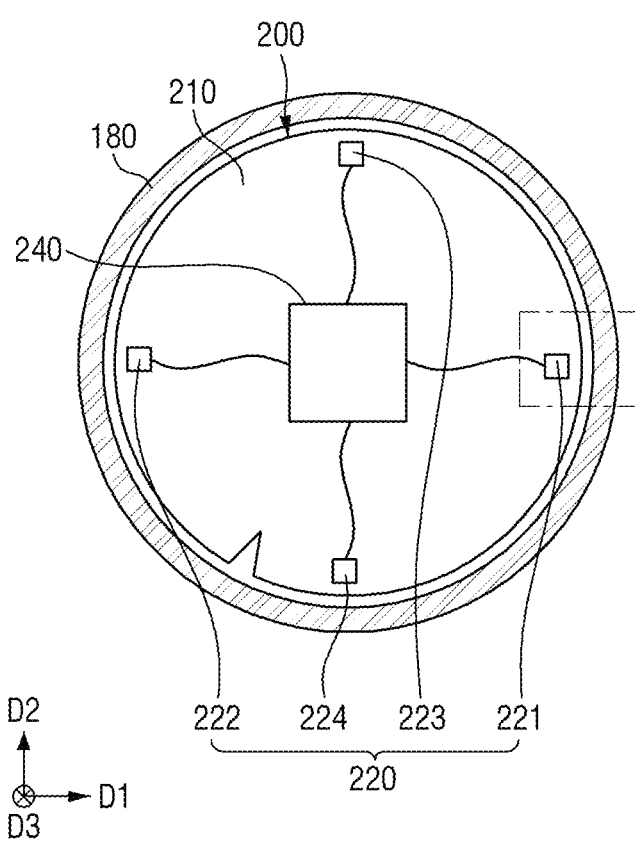

Referring to FIG. 18, the imaging unit 220 may include the first unit 221, the second unit 222, the third unit 223, and a fourth unit 224. That is, the imaging unit 220 may include four units.

The first unit 221 and the second unit 222 may be opposite to each other in the first direction D1. The third unit 223 and the fourth unit 224 may be opposite to each other in the second direction D2. Although not shown, each of the third unit 223 and the fourth unit 224 may image the sidewall of the body 210 and the upper surface of the edge ring 180. Based on the imaged image, the spacing between the sidewall of the body 210 and the upper surface of the edge ring 180 may be calculated. The substrate alignment sensor 200 may be correctly aligned with the substrate support unit 170 using the calculated spacing.

As the imaging unit 220 includes the four units, misalignment of the substrate alignment sensor 200 may be calculated more precisely. Accordingly, the substrate alignment sensor 200 may be precisely aligned with the substrate support unit 170.

In FIG. 18, the first unit 221, the second unit 222, the third unit 223, and the fourth unit 224 are shown to be arranged so as to be spaced from each other by a right angle. However, technical ideas of the present disclosure are not limited thereto. It may be obvious that the angle defined by adjacent ones of the first unit 221, the second unit 222, the third unit 223, and the fourth unit 224 may vary depending on the design.

Although not shown, the imaging unit 220 may include five or more units.

Hereinafter, with reference to FIGS. 19 to 23, a substrate processing apparatus according to still further some embodiments of the present disclosure is described. For convenience of description, contents duplicate with the contents described above using FIG. 1 to FIG. 8 are simply described or the descriptions thereof are omitted.

Figure 19:
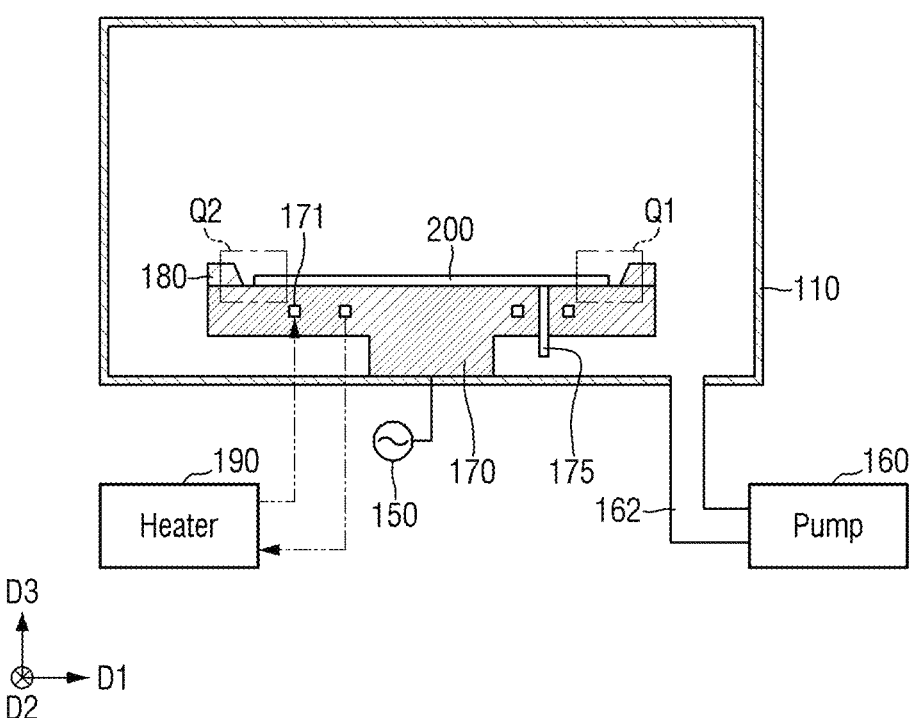
FIG. 19 is a diagram for illustrating a substrate processing apparatus according to further some embodiments of the present disclosure.
Figure 20:
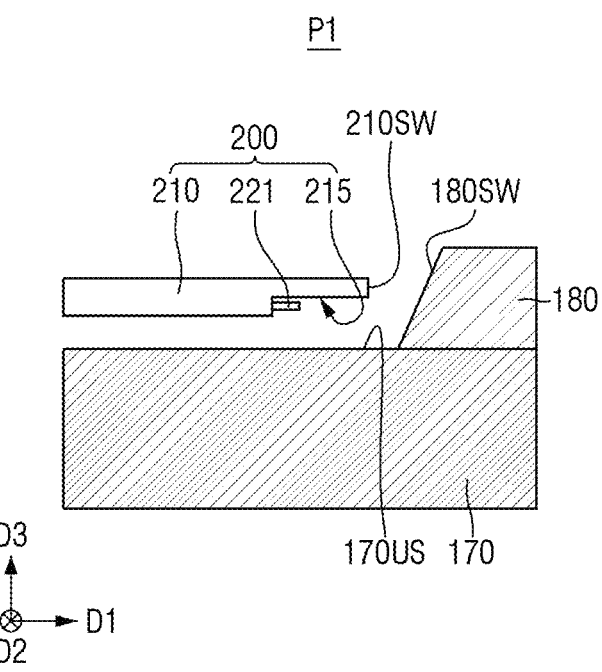
FIG. 20 is an enlarged view of a Q1 area in FIG. 19.
Figure 21:
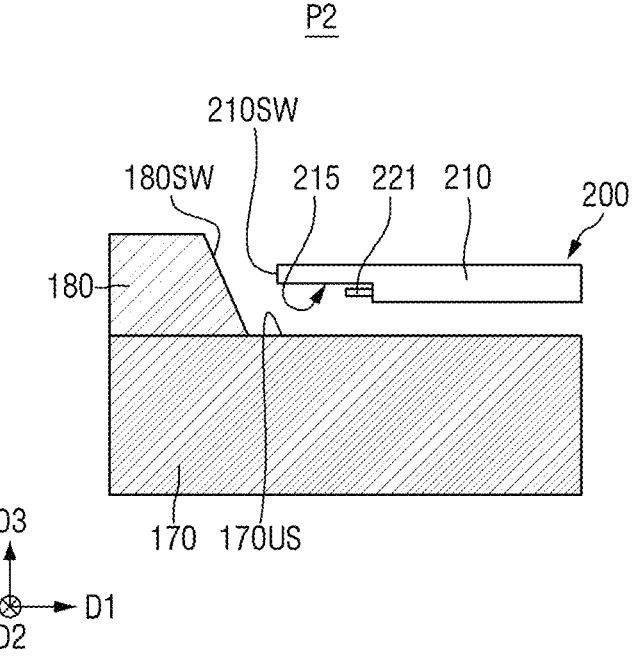
FIG. 21 is an enlarged view of a Q2 area in FIG. 19.
Figure 22:
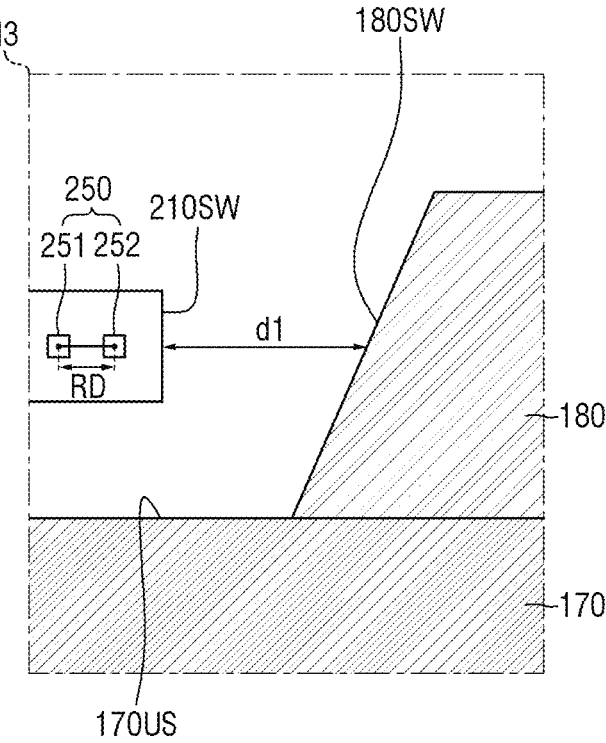
FIG. 22 is a diagram showing a third image imaged by a first unit.
Figure 23:
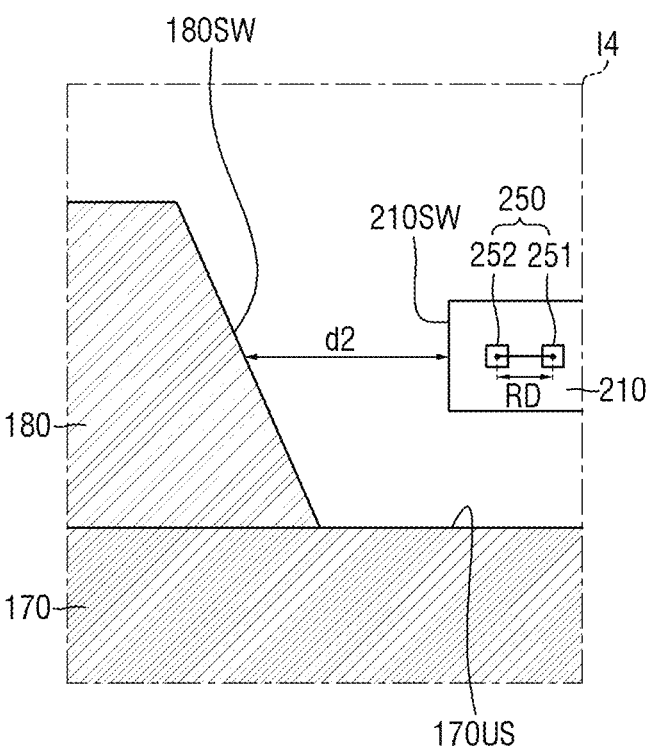
FIG. 23 is a diagram showing a fourth image imaged by a second unit.

FIG. 19 is a diagram for illustrating a substrate processing apparatus according to still further some embodiments of the present disclosure. FIG. 20 is an enlarged view of a Q1 area in FIG. 19. FIG. 21 is an enlarged view of a Q2 area in FIG. 19. FIG. 22 is a diagram showing a third image imaged by a first unit. FIG. 23 is a diagram showing a fourth image imaged by a second unit.

First, referring to FIGS. 19 to 21, the substrate processing apparatus according to some embodiments may include the process chamber 110, the substrate support unit 170, and the edge ring 180. The process chamber 110 may perform a deposition process on a substrate. However, technical ideas of the present disclosure are not limited thereto.

The substrate support unit 170 may include an electrostatic chuck configured to support the substrate thereon using an electro-static force, and a chuck support for supporting the electrostatic chuck thereon. The electrostatic chuck may receive an electrode for chucking and de-chucking the substrate therein. The chuck support may support the electrostatic chuck disposed thereon and may be made of a metal such as aluminum or a ceramic insulator such as alumina. A heating member such as a heater may be disposed in the chuck support, and heat from the heater may be transferred to the electrostatic chuck or the substrate. Furthermore, a power application line connected to the electrode of the electrostatic chuck may be disposed in the chuck support. However, the configuration of the substrate support unit 170 is not limited thereto, and the substrate support unit 170 may include a vacuum chuck configured to support the substrate using a vacuum, or may be configured to mechanically support the substrate thereon.

The edge ring 180 may be disposed on the substrate support unit 170. The edge ring 180 may be in contact with the upper surface 170US of the substrate support unit 170. The edge ring 180 may be disposed along an edge of the substrate support unit 170 while being disposed on the upper surface 170US of the substrate support unit 170. The edge ring 180 may surround the substrate or the substrate alignment sensor 200. The edge ring 180 may accurately seat the substrate and serve as a focus ring to intensively supply plasma to the substrate.

Referring to FIG. 22, the first unit 221 may image a third image I3. The third image I3 may be an image of the sidewall 210SW of the body 210 and the sidewall 180SW of the edge ring 180. Furthermore, the first unit 221 may image the reference mark 250. The reference mark 250 may be formed on the body 210 of the substrate alignment sensor 200. The control unit 240 may check whether the substrate alignment sensor 200 is correctly aligned with the substrate support unit 170 using the reference mark 250.

Specifically, the control unit 240 may calculate the first spacing d1. The first spacing d1 may be a distance from the sidewall 210SW of the body 210 to the sidewall 180SW of the edge ring 180. More specifically, the first spacing d1 may be a distance in the first direction D1 from the sidewall 210SW of the body 210 to the sidewall 180SW of the edge ring 180.

The first spacing d1 may be calculated using the reference mark 250. For example, the reference mark 250 includes the first mark 251 and the second mark 252. The first mark 251 and the second mark 252 may be spaced apart from each other in the first direction D1. The spacing RD between the first mark 251 and the second mark 252 may be a preset value. For example, the spacing RD between the first mark 251 and the second mark 252 may be in a range of 500 μm to 1 mm. However, technical ideas of the present disclosure are not limited thereto.

The control unit 240 may calculate a ratio of the spacing RD between the first mark 251 and the second mark 252 with respect to the first spacing d1 on the third image I3. Thus, the first spacing d1 may be accurately calculated based on the ratio.

Referring to FIG. 23, the second unit 222 may image a fourth image I4. The fourth image I4 may be an image of the sidewall 210SW of the body 210 and the sidewall 180SW of the edge ring 180. Furthermore, the second unit 222 may image the reference mark 250. The reference mark 250 may be formed on the body 210 of the substrate alignment sensor 200. The control unit 240 may check whether the substrate alignment sensor 200 is correctly aligned with the substrate support unit 170 using the reference mark 250.

Specifically, the control unit 240 may calculate the second spacing d2. The second spacing d2 may be the distance from the sidewall 210SW of the body 210 to the sidewall 180SW of the edge ring 180. More specifically, the second spacing d2 may be the distance in the direction opposite to the first direction D1 from the sidewall 210SW of the body 210 to the sidewall 180SW of the edge ring 180.

The second spacing d2 may be calculated using the reference mark 250. For example, the control unit 240 may calculate a ratio of the spacing RD between the first mark 251 and the second mark 252 with respect to the second spacing d2 on the fourth image I4. Thus, the second spacing d2 may be accurately calculated based on the ratio.

In some embodiments, when the first spacing d1 and the second spacing d2 are different from each other, it may be determined that the substrate alignment sensor 200 is not correctly aligned with the substrate support unit 170. At this time, the control unit 240 may realign the substrate alignment sensor 200. The substrate alignment sensor 200 may be displaced to a certain position until the first spacing d1 and the second spacing d2 become equal to each other.

When the first spacing d1 and the second spacing d2 are equal to each other, it may be determined that the substrate alignment sensor 200 is correctly aligned with the substrate support unit 170. That is, when the substrate alignment sensor 200 is correctly aligned with the substrate support unit 170, the first spacing d1 and the second spacing d2 may be equal to each other.

Hereinafter, a method for operating the substrate processing apparatus of the present disclosure is described with reference to FIGS. 24 to 26.

Figure 24:
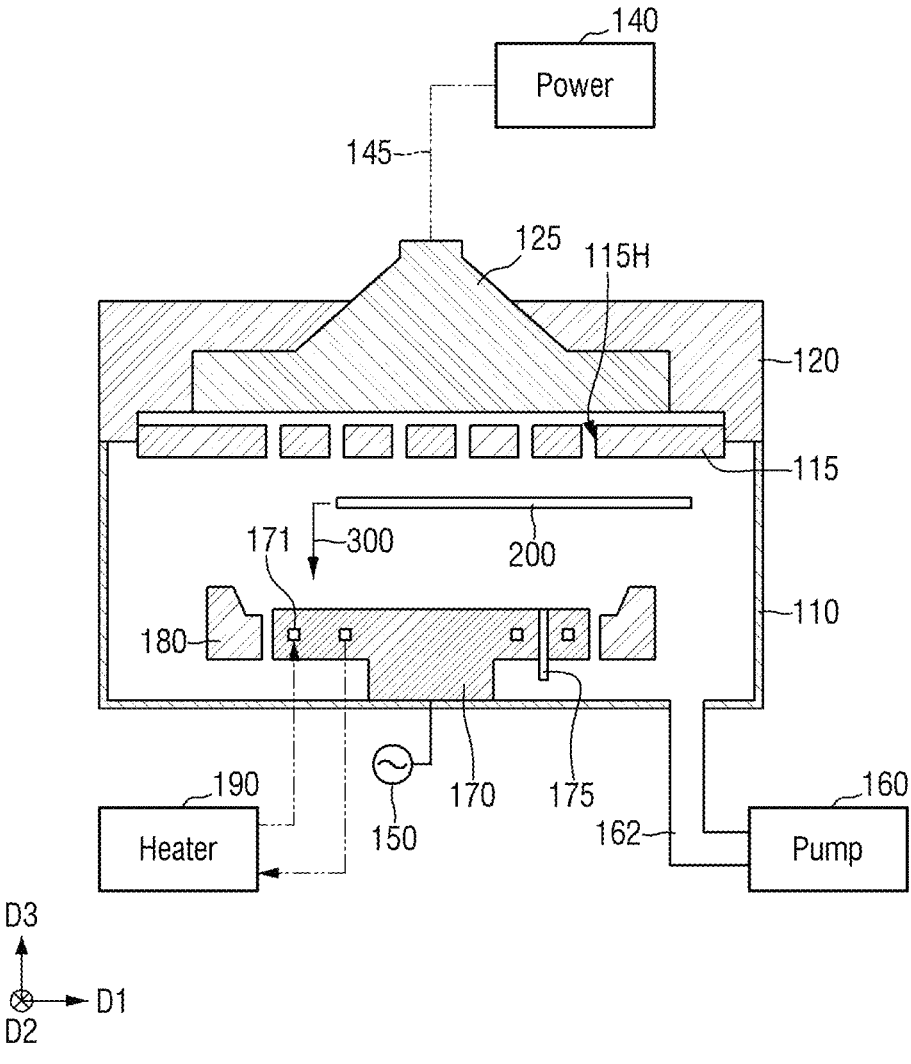
FIGS. 24 to 26 are intermediate diagrams for illustrating a method for operating a substrate processing apparatus in accordance with the present disclosure.
Figure 25:
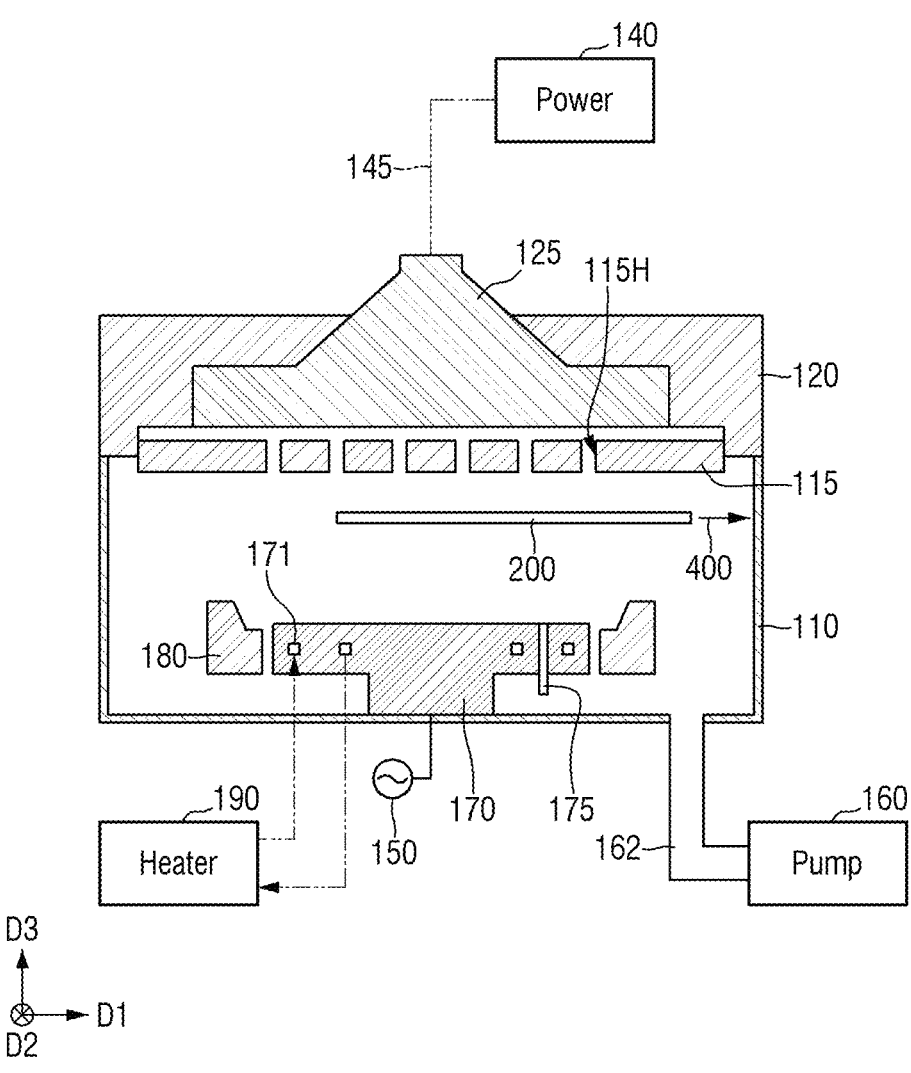
Figure 26:
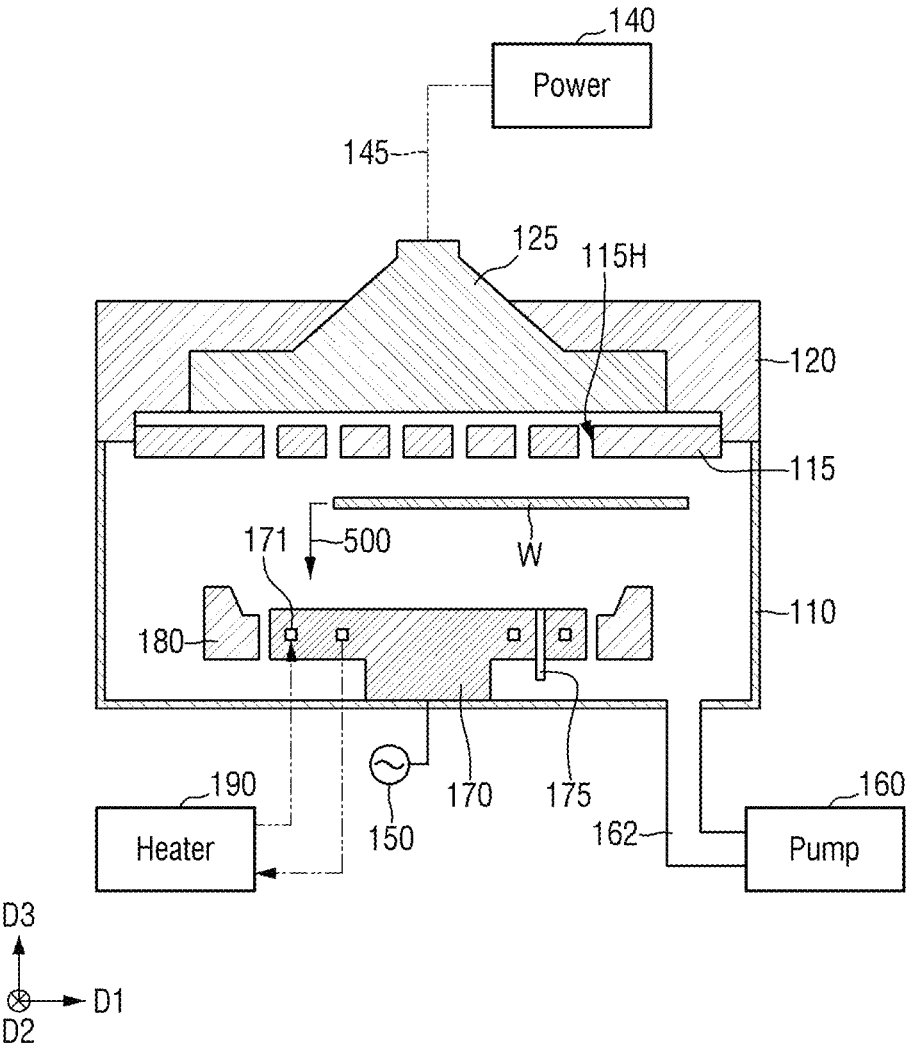

FIGS. 24 to 26 are intermediate diagrams for illustrating the method for operating the substrate processing apparatus in accordance with the present disclosure.

Referring to FIG. 24, the substrate alignment sensor 200 may be brought into the substrate processing apparatus. The substrate alignment sensor 200 may be brought into the process chamber 110. The substrate alignment sensor 200 may be loaded on the substrate support unit 170 (see drawing number 300). The substrate alignment sensor 200 may be disposed on the substrate support unit 170. At this time, the substrate alignment sensor 200 may not be aligned correctly with the substrate support unit 170.

The substrate alignment sensor 200 may be correctly aligned with the substrate support unit 170. For example, the substrate alignment sensor 200 may be correctly aligned with the substrate support unit 170 using the imaging unit 220 and the control unit 240. Specifically, referring to FIG. 7 and FIG. 8, the imaging unit 220 may image the sidewall 210SW of the body 210 of the substrate alignment sensor 200 and the upper surface 180US of the edge ring 180.

Accordingly, the first unit 221 may acquire the first image I1, and the second unit 222 may acquire the second image I2. The control unit 240 may calculate the first spacing d1, the third spacing d3, the fifth spacing d5, and/or the seventh spacing d7 using the first image I1. The control unit 240 may calculate the second spacing d2, the fourth spacing d4, the sixth spacing d6, and/or the eighth spacing d8 using the second image I2. The substrate alignment sensor 200 may be displaced until the first spacing d1 and the second spacing d2 become equal to each other. Furthermore, the substrate alignment sensor 200 may be displaced until the third spacing d3 and the fourth spacing d4 become equal to each other. The substrate alignment sensor 200 may be displaced until the fifth spacing d5 and the sixth spacing d6 become equal to each other. The substrate alignment sensor 200 may be displaced until the seventh spacing d7 and the eighth spacing d8 become equal to each other.

The first spacing d1 and the second spacing d2 may be brought into being equal to each other, such that the substrate alignment sensor 200 may be correctly aligned with the substrate support unit 170. Furthermore, the third spacing d3 and the fourth spacing d4 may be brought into being equal to each other, such that the substrate alignment sensor 200 may be correctly aligned with the substrate support unit 170. Furthermore, the fifth spacing d5 and the sixth spacing d6 may be brought into being equal to each other, such that the substrate alignment sensor 200 may be correctly aligned with the substrate support unit 170. Furthermore, the seventh spacing d7 and the eighth spacing d8 may be brought into being equal to each other, such that the substrate alignment sensor 200 may be correctly aligned with the substrate support unit 170.

Referring to FIG. 25, the substrate alignment sensor 200 may be taken out of the process chamber 110 (see drawing number 400). Next, referring to FIG. 26, the substrate W may be brought into the process chamber 110. The substrate W may be loaded onto the substrate support unit 170 (see drawing number 500).

Because the substrate alignment sensor 200 has been correctly aligned with the substrate support unit 170, the substrate W of the same size as that of the substrate alignment sensor 200 may also be correctly aligned with the substrate support unit 170. Subsequently, an etching process and/or a deposition process may be performed on the substrate W.

Thus, the substrate W may be correctly aligned using the substrate processing apparatus of the present disclosure. Thus, reliability of various processes performed on the substrate W may be improved.

One or more elements described above may be implemented using processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, a programmable logic unit, a microprocessor, application-specific integrated circuit (ASIC), etc. The processing circuitry may include a memory such as a volatile memory device (e.g., SRAM, DRAM, SDRAM) and/or a non-volatile memory (e.g., flash memory device, phase-change memory, ferroelectric memory device).

In concluding the detailed description, those skilled in the art will appreciate that many variations and modifications may be made to the presented embodiments without substantially departing from the principles of the present disclosure. Therefore, the presented embodiments of the disclosure are used in a generic and descriptive sense only and not for purposes of limitation.

What is claimed is:

1. A substrate processing apparatus comprising:
a process chamber configured to have a substrate loaded therein;
a substrate support unit in a lower portion of the process chamber, the substrate support unit being configured to support the substrate;
an edge ring along an edge of the substrate support unit and spaced apart from a sidewall of the substrate support unit; and
a substrate alignment sensor on the substrate support unit,
wherein an upper surface of the edge ring includes a first portion, a second portion, and a third portion, the first portion and the second portion extend parallel to each other, the third portion is between the first portion and the second portion, and the third portion is inclined,
wherein, based on a bottom surface of the process chamber, a vertical level of the first portion is lower than a vertical level of the second portion,
wherein the substrate alignment sensor includes a body, an imaging unit, and a control unit,
the imaging unit is on a bottom surface of the body and configured to image an upper surface of the edge ring and a sidewall of the body, and
the control unit is configured to control the imaging unit and calculate a calculated spacing from the sidewall of the body to a boundary between the first portion of the edge ring and the third portion of the edge ring, and
wherein the control unit is configured to align the substrate alignment sensor with the substrate support unit based on the calculated spacing.

2. The substrate processing apparatus of claim 1, wherein the substrate alignment sensor includes a groove,
the groove is recessed from the bottom surface of the body toward an upper surface of the body, and
the imaging unit is in the groove.

3. The substrate processing apparatus of claim 2, wherein the substrate alignment sensor includes an illuminator installed in the groove,
the illuminator is configured to irradiate light toward the edge ring.

4. The substrate processing apparatus of claim 3, wherein the imaging unit includes at least two imaging units in the groove.

5. The substrate processing apparatus of claim 1, wherein the imaging unit includes a first unit and a second unit, and the first unit and the second unit are opposite each other in a first direction.

6. The substrate processing apparatus of claim 5, wherein the control unit is configured to align the substrate alignment sensor with the substrate support unit based on a first spacing and a second spacing,
the calculated spacing includes the first spacing and the second spacing,
the first spacing is a distance from the sidewall of the body to the boundary between the first portion of the edge ring and the third portion of the edge ring based on an image captured by the first unit,
the second spacing is a distance from the sidewall of the body to the boundary between the first portion of the edge ring and the third portion of the edge ring based on an image captured by the second unit.

7. The substrate processing apparatus of claim 1, wherein the imaging unit includes a first unit and a second unit,
an angle defined by the first unit and the second unit around a center of the substrate alignment sensor is not 180°.

8. The substrate processing apparatus of claim 1, wherein the imaging unit includes a first unit, a second unit, and a third unit,
wherein the first unit, the second unit, and the third unit are spaced from each other by a same angular spacing from a common reference point.

9. The substrate processing apparatus of claim 1, wherein the imaging unit further includes a first unit, a second unit, a third unit, and a fourth unit,
the first unit and the second unit are opposite each other in a first direction,
the third unit and the fourth unit are opposite each other in a second direction, and
the second direction intersects the first direction.

10. The substrate processing apparatus of claim 1, wherein
the substrate alignment sensor includes a reference mark on the body,
wherein the control unit is configured to calculate the calculated spacing based on a distance from the sidewall of the body to the boundary between the first portion of the edge ring and the third portion of the edge ring using the reference mark.

11. A substrate processing apparatus comprising:
a process chamber configured to have a substrate loaded therein;
a substrate support unit in a lower portion of the process chamber, the substrate support unit being configured to support the substrate;
an edge ring on and along an edge of an upper surface of the substrate support unit and protruding from the upper surface of the substrate support unit; and
a substrate alignment sensor on the substrate support unit,
wherein the substrate alignment sensor includes a body, an imaging unit, and a control unit,
the imaging unit is on a bottom surface of the body and configured to image a sidewall of the edge ring and a sidewall of the body,
the control unit is configured to control the imaging unit and calculate a calculated spacing between the sidewall of the edge ring and the sidewall of the body, and
the control unit is configured to align the substrate alignment sensor with the substrate support unit based on the calculated spacing.

12. The substrate processing apparatus of claim 11, wherein the substrate alignment sensor includes a groove, the groove is recessed from the bottom surface of the body toward an upper surface of the body, the imaging unit is in the groove.

13. The substrate processing apparatus of claim 12, wherein the substrate alignment sensor includes an illuminator in the groove, the illuminator is configured to irradiate light in a first direction toward the edge ring, the imaging unit faces a second direction, and the second direction intersects the first direction.

14. The substrate processing apparatus of claim 12, wherein the imaging unit includes at least two imaging units in the groove, and angles of view (AOV) of the at least two imaging units in the groove are different from each other.

15. The substrate processing apparatus of claim 11, wherein the imaging unit includes a first unit and a second unit, and the first unit and the second unit are opposite each other in a first direction.

16. The substrate processing apparatus of claim 15, wherein the control unit is configured to align the substrate alignment sensor with the substrate support unit based on a first spacing and a second spacing, the calculated spacing includes the first spacing and the second spacing, the first spacing is a distance between the sidewall of the edge ring and the sidewall of the body based on an image captured by the first unit, the second spacing is a distance between the sidewall of the edge ring and the sidewall of the body based on an image captured by the second unit.

17. The substrate processing apparatus of claim 16, wherein the first spacing is equal to the second spacing.

18. The substrate processing apparatus of claim 11, wherein the imaging unit includes a first unit and a second unit, and an angle defined by the first unit and the second unit around a center of the substrate alignment sensor is not 180°.

19. The substrate processing apparatus of claim 11, wherein the substrate alignment sensor includes a reference mark on the body, the control unit is configured to calculate the calculated spacing between the sidewall of the edge ring and the sidewall of the body using the reference mark.

20. A substrate processing apparatus comprising:

a process chamber configured to have a substrate loaded therein;

a substrate support unit in a lower portion of the process chamber, the substrate support unit being configured to support the substrate;

an edge ring along an edge of the substrate support unit and spaced apart from a sidewall of the substrate support unit; and a substrate alignment sensor on the substrate support unit, wherein an upper surface of the edge ring includes a first portion, a second portion, and a third portion, the first portion and the second portion extend parallel to each other, and the third portion is between the first portion and the second portion and the third portion is inclined, wherein, based on a bottom surface of the process chamber, a vertical level of the first portion is lower than a vertical level of the second portion, wherein the substrate alignment sensor includes a body, a groove recessed from a bottom surface of the body toward an upper surface of the body, an illuminator, an imaging unit, and a control unit, the illuminator in the groove and configured to irradiate light in a first direction toward the edge ring, the imaging unit is in the groove and configured to image an upper surface of the edge ring and a sidewall of the body, the control unit is configured to control the imaging unit and calculate a calculated spacing from the sidewall of the body to a boundary between the first portion and the third portion of the edge ring, the imaging unit faces a second direction, the second direction intersects the first direction, wherein the imaging unit includes a first unit and a second unit, the first unit and the second unit are opposite each other in the first direction, wherein the control unit is configured to align the substrate alignment sensor with the substrate support unit by equalizing a first spacing and a second spacing, wherein the first spacing is a distance from the sidewall of the body to the boundary between the first portion and the third portion of the edge ring on an image captured by the first unit, and wherein the second spacing is a distance from the sidewall of the body to the boundary between the first portion and the third portion of the edge ring on an image captured by the second unit.

* * * * *